(12) United States Patent
Baraniuk et al.

(10) Patent No.: US 10,985,777 B2
(45) Date of Patent: Apr. 20, 2021

(54) SIGNAL RECOVERY VIA DEEP CONVOLUTIONAL NETWORKS

(71) Applicant: William Marsh Rice University, Houston, TX (US)

(72) Inventors: Richard G. Baraniuk, Houston, TX (US); Ali Mousavi, Houston, TX (US)

(73) Assignee: William Marsh Rice University, Houston, TX (US)

( * ) Notice: Subject to any disclaimer, the term of this patent is extended or adjusted under 35 U.S.C. 154(b) by 104 days.

(21) Appl. No.: 16/466,718

(22) PCT Filed: Dec. 6, 2017

(86) PCT No.: PCT/US2017/064910
§ 371 (c)(1),
(2) Date: Jun. 5, 2019

(87) PCT Pub. No.: WO2018/106805
PCT Pub. Date: Jun. 14, 2018

(65) Prior Publication Data
US 2019/0340497 A1 Nov. 7, 2019

Related U.S. Application Data

(60) Provisional application No. 62/432,230, filed on Dec. 9, 2016.

(51) Int. Cl.
*H03M 7/30* (2006.01)
*G06N 3/04* (2006.01)
(Continued)

(52) U.S. Cl.
CPC ........ *H03M 7/3062* (2013.01); *G06N 3/0454* (2013.01); *G06N 3/084* (2013.01); *G06T 11/005* (2013.01); *H03M 7/70* (2013.01)

(58) Field of Classification Search
None
See application file for complete search history.

(56) References Cited

U.S. PATENT DOCUMENTS

2011/0182469 A1 7/2011 Ji et al.
2013/0342681 A1 12/2013 Duong
(Continued)

OTHER PUBLICATIONS

Kulkarni et al, "ReconNet: Non-Iterative Reconstruction of Images from Compressively Sensed Measurements" (published at 2016 IEEE Conference on Computer Vision and Pattern Recognition (CVPR), pp. 449-458, Jun. 2016).*
(Continued)

*Primary Examiner* — Casey L Kretzer
(74) *Attorney, Agent, or Firm* — Kowert, Hood, Munyon, Rankin & Goetzel, P.C.

(57) ABSTRACT

Real-world data may not be sparse in a fixed basis, and current high-performance recovery algorithms are slow to converge, which limits compressive sensing (CS) to either non-real-time applications or scenarios where massive back-end computing is available. Presented herein are embodiments for improving CS by developing a new signal recovery framework that uses a deep convolutional neural network (CNN) to learn the inverse transformation from measurement signals. When trained on a set of representative images, the network learns both a representation for the signals and an inverse map approximating a greedy or convex recovery algorithm. Implementations on real data indicate that some embodiments closely approximate the solution produced by state-of-the-art CS recovery algorithms, yet are hundreds of times faster in run time.

20 Claims, 20 Drawing Sheets

(51) Int. Cl.
*G06N 3/08* (2006.01)
*G06T 11/00* (2006.01)

(56) References Cited

U.S. PATENT DOCUMENTS

2014/0270431 A1    9/2014  Xu et al.
2016/0328643 A1    11/2016 Liu et al.
2018/0137857 A1*   5/2018  Zhou .................. G10L 15/32

OTHER PUBLICATIONS

International Search Report issued in International Application No. PCT/US2017/064910 dated Feb. 12, 2018.
Written Opinion of the International Searching Authority issued in International Application No. PCT/US2017/064910 dated Feb. 12, 2018.
Irena Orivic et al. "Compressive Sensing in Signal Processing: Algorithms and Transform Domain Formulations," Mathematical Problems in Engineering, Aug. 2, 2016, vol. 2016, Article ID 7616393, Hindawi Publishing Corporation, http://dx.doi.org/10.1155/2016/7616393.

\* cited by examiner

SIGNAL RECOVERY VIA DEEP CONVOLUTIONAL NETWORKS

PRIORITY CLAIM

This application is a National Stage Application of, and claims priority to, Patent Cooperation Treaty International Application Number PCT/US2017/064910, titled "Signal Recovery Via Deep Convolutional Networks" and filed on Dec. 6, 2017, which claims priority to U.S. Provisional Patent Application No. 62/432,230, titled "Signal Recovery Via Deep Convolutional Networks" and filed on Dec. 9, 2016, which are both hereby incorporated by reference in their entirety, as though fully and completely set forth herein.

STATEMENT OF GOVERNMENT RIGHTS

This invention was made with government support under U.S. Army Research Office Grant No. W911NF-15-1-0316, National Science Foundation Grant No. CCF1527501, and Department of Defense: Defense Advanced Research Projects Agency Grant No. HR0011-16-C-0028. The government has certain rights in the invention.

FIELD OF THE INVENTION

The present invention relates to the field of compressive sensing, and more particularly to systems and methods for using deep convolutional networks for signal recovery using compressive sensing hardware.

DESCRIPTION OF THE RELATED ART

According to Nyquist theory, a signal x(t) whose signal energy is supported on the frequency interval [−B,B] may be reconstructed from samples {x(nT)} of the signal x(t), provided the rate $f_S=1/T_S$ at which the samples are captured is sufficiently high, i.e., provided that $f_S$ is greater than 2B. Similarly, for a signal whose signal energy is supported on the frequency interval [A,B], the signal may be reconstructed from samples captured with sample rate greater than B−A. A fundamental problem with any attempt to capture a signal x(t) according to Nyquist theory is the large number of samples that are generated, especially when B (or B−A) is large. The large number of samples is taxing on memory resources and on the capacity of transmission channels.

Nyquist theory is not limited to functions of time. Indeed, Nyquist theory applies more generally to any function of one or more real variables. For example, Nyquist theory applies to functions of two spatial variables such as images, to functions of time and two spatial variables such as video, and to the functions used in multispectral imaging, hyperspectral imaging, medical imaging and a wide variety of other applications. In the case of an image I(x,y) that depends on spatial variables x and y, the image may be reconstructed from samples of the image, provided the samples are captured with sufficiently high spatial density. For example, given samples {I(nΔx,mΔy)} captured along a rectangular grid, the horizontal and vertical densities 1/Δx and 1/Δy should be respectively greater than $2B_x$ and $2B_y$, where $B_x$ and $B_y$ are the highest x and y spatial frequencies occurring in the image I(x,y). The same problem of overwhelming data volume is experienced when attempting to capture an image according to Nyquist theory. The modern theory of compressive sensing is directed to such problems.

Compressive sensing relies on the observation that many signals (e.g., images or video sequences) of practical interest are not only band-limited but also sparse or approximately sparse when represented using an appropriate choice of transformation, for example, a transformation such as a Fourier transform, a wavelet transform or a discrete cosine transform (DCT). A signal vector v is said to be K-sparse with respect to a given transformation T when the transformation of the signal vector, Tv, has no more than K non-zero coefficients. A signal vector v is said to be sparse with respect to a given transformation T when it is K-sparse with respect to that transformation for some integer K much smaller than the number L of components in the transformation vector Tv.

A signal vector v is said to be approximately K-sparse with respect to a given transformation T when the coefficients of the transformation vector, Tv, are dominated by the K largest coefficients (i.e., largest in the sense of magnitude or absolute value). In other words, if the K largest coefficients account for a high percentage of the energy in the entire set of coefficients, then the signal vector v is approximately K-sparse with respect to transformation T. A signal vector v is said to be approximately sparse with respect to a given transformation T when it is approximately K-sparse with respect to the transformation T for some integer K much less than the number L of components in the transformation vector Tv.

Compressive sensing specifies a way of operating on the N samples of an image so as to generate a much smaller set of samples from which the N samples may be reconstructed, given knowledge of the transform under which the image is sparse (or approximately sparse). In traditional implementations, discovering an appropriate transformation for a particular image or class of images can be a computationally intensive and time-consuming task. Improvements in the field are therefore desirable.

SUMMARY

Embodiments presented herein propose a new signal recovery framework called DeepInverse that learns the inverse transformation from measurement vectors y to signals x using a deep convolutional neural network (CNN). In some embodiments, the framework is implemented as a method wherein a convolutional neural network is trained to perform signal recovery by adjusting a set of weight and bias functions. Subsequent to completion of the training process, the method may perform signal recovery on measured signals using the adjusted set of weight and bias functions.

In some embodiments, the training process may be configured to be implemented by a processor coupled to a memory medium. The processor may be configured to receive a reference signal x. The reference signal may be an image, an MM image, a CT scan, accelerometer data, or any other signal. The reference signal may be used to derive a measurement vector y, and the measurement vector y may be of a smaller size than the reference signal x. The measurement vector may comprise compressive sensing (CS) data derived from the reference signal x, and the measurement vector may serve as an input into the convolutional neural network. The signal recovery process may then be used to recover the reference signal from the measurement vector.

In some embodiments, the processor may perform a matrix transformation on the input (CS) data. The matrix transformation may transform the input CS data into a proxy signal for the reference signal. The proxy signal may be of the same size as the reference signal, in some embodiments.

In contrast to previous implementations, the matrix transformation may not act separately on blocks of the measurement vector. For example, the matrix transformation may not comprise a block diagonal matrix. Certain applications such as MRI image recovery employ, for example, a Fourier sparse basis, wherein a block diagonal matrix transformation is unable to represent many Fourier components. Performing the matrix transformation on the entirety of the measurement vector may allow for recovery of signals that require a Fourier sparse basis, or another basis that is not representable in a block diagonal form.

In some embodiments, the signal proxy may be processed by a series of subsequent layers in the CNN. Each layer may comprise one or more filters and channels, wherein filters of subsequent layers comprise sequentially higher-order feature maps, and channels comprise dependencies of filters on previous layers. Each filter may comprise a vector of data points that is the same size as the signal proxy (hence, it may also be the same size as the reference signal). Each channel may connect a particular data point in a particular filter to a subset of data points comprising a localized region in a filter within a previous layer. This distinguishes these embodiments from 'fully-connected' layers, wherein a channel connects a data point to all data points in a previous layer. An example of a fully connected layer is given in FIG. 1. This sparse connectivity between layers may significantly reduce training time, and may also prevent overfitting.

In some embodiments, processing the signal proxy at a particular layer may comprise, by each filter in the layer, and for each data point in each respective filter, applying a weight function and a bias function to the subset of data points connected by each channel. The weight and bias functions may be set to an initial value, and subsequently trained during a backpropagation procedure. In some embodiments, a single weight function may be shared between all data points in a particular filter. As one nonlimiting example, this may reduce the time and computational resources required to complete the training procedure, by reducing the number of weight functions that will be adjusted. Each filter may then apply the same weight function to all of its data points, in these embodiments.

In some embodiments, the final layer of the CNN may comprise a single filter, and the single filter may result in a single feature map that comprises the recovered signal. The recovered signal may be compared to the (known) reference signal to compute a loss function. In some embodiments, a gradient function may be calculated in the space of weight and bias functions. Backpropagation may be employed, wherein the gradient function is used to adjust the weight and bias functions in such a way as to minimize the loss function. After completion of back propagation, the training process may iteratively repeat in a series of subsequent epochs, wherein each epoch comprises recovering a data signal from a measurement signal, performing backpropagation, and adjusting the weight and bias functions to minimize a loss function.

In some embodiments, once the CNN has been trained, it may be used to recover data from other (unknown) sources, using the trained weight and bias functions. While the training process may be computationally intensive, it may only need to be performed once for a given class of signals. After completion of the training process, the trained CNN may be used to rapidly perform signal recovery from compressive sensing measurement vectors of many different unknown data signals.

Figure 1:
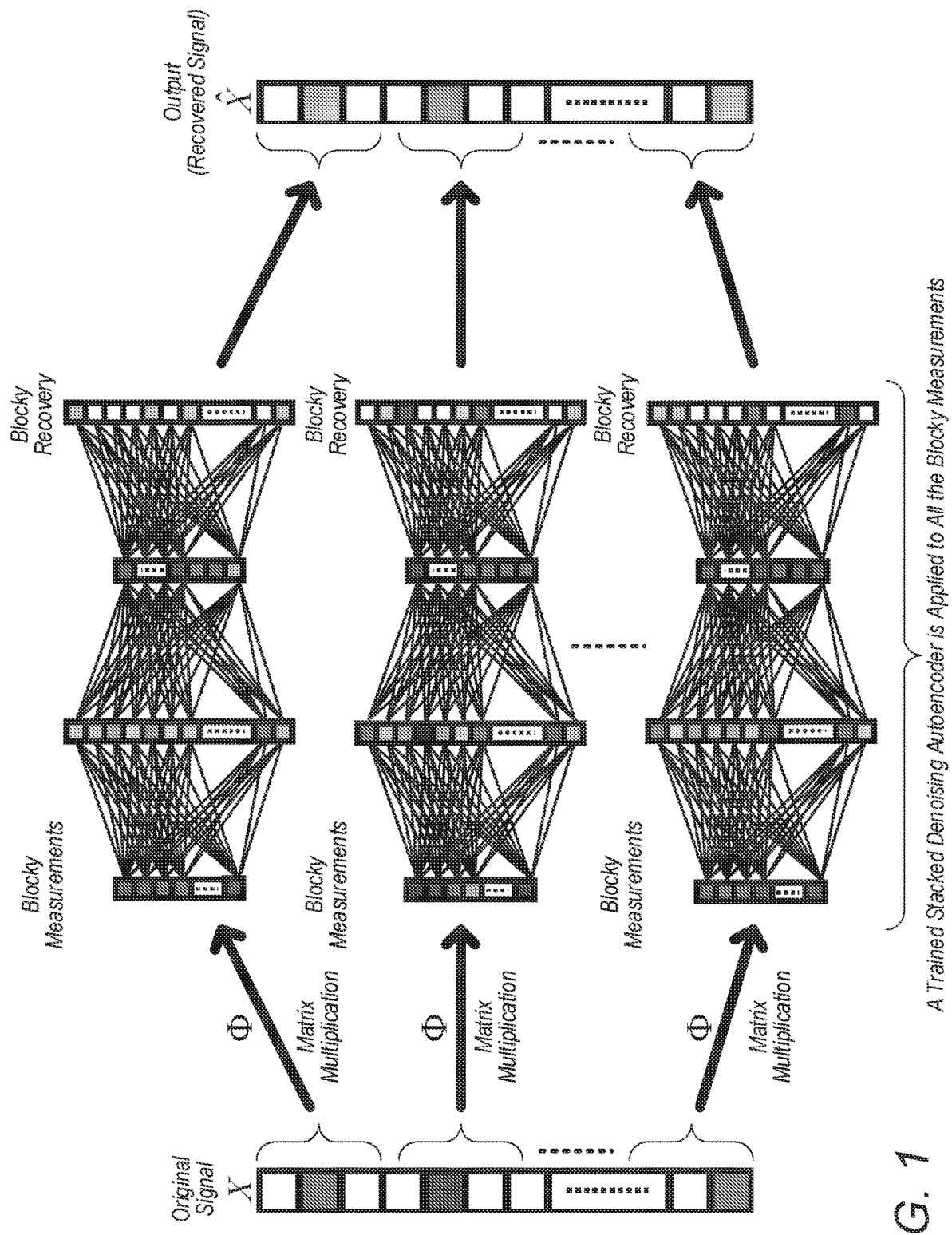
FIG. 1 illustrates a method for performing block divided signal recovery using a fully connected stacked denoising autoencoder, according to some prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

INCORPORATED BY REFERENCE

The following patent applications and published papers are incorporated by reference and provide teachings regarding compressive sensing and convolutional neural networks:
(1) U.S. Pat. No. 8,199,244 B2, titled "Method and Apparatus for Compressive Imaging Device", published Jun. 12, 2012.
(2) A. Mousavi, A. B. Patel, and R. G. Baraniuk, "A deep learning approach to structured signal recovery," in Proc. Allerton Conf. Communication, Control, and *Computing*. IEEE, 2015, pp. 1336-1343.
(3) K. Kulkarni, S. Lohit, P. Turaga, R. Kerviche, and A. Ashok, "Reconnet: Non-iterative reconstruction of images from compressively sensed random measurements," Proc. IEEE Int. Conf. Comp. Vision, and Pattern Recognition, 2016.
(4) D. E. Rumelhart, G. E Hinton, and R. J. Williams, "Learning representations by back-propagating errors," Cognitive Modeling, vol. 5, pp. 3, 1988.
(5) S. Ioffe and C. Szegedy, "Batch normalization: Accelerating deep network training by reducing internal covariate shift," arXiv preprint arXiv:1502.03167, 2015.
(6) A. L. Maas, A. Y. Hannun, and A. Y. Ng, "Rectifier nonlinearities improve neural network acoustic models," in Proc. Int. Conf. Machine Learning, 2013, vol. 30.

Terminology

A memory medium is a non-transitory medium configured for the storage and retrieval of information. Examples of memory media include: various kinds of semiconductor-based memory such as RAM and ROM; various kinds of magnetic media such as magnetic disk, tape, strip and film; various kinds of optical media such as CD-ROM and DVD-ROM; various media based on the storage of electrical charge and/or any of a wide variety of other physical quantities; media fabricated using various lithographic techniques; etc. The term "memory medium" includes within its scope of meaning the possibility that a given memory medium might be a union of two or more memory media that reside at different locations, e.g., on different chips in a system or on different computers in a network. A memory medium is typically computer-readable, e.g., is capable of being read by a computer.

A computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

A computer system is any device (or combination of devices) having at least one processor that is configured to execute program instructions stored on a memory medium. Examples of computer systems include personal computers (PCs), workstations, laptop computers, tablet computers, mainframe computers, server computers, client computers, network or Internet appliances, hand-held devices, mobile devices, personal digital assistants (PDAs), computer-based television systems, grid computing systems, wearable computers, computers implanted in living organisms, computers embedded in head-mounted displays, computers embedded in sensors forming a distributed network, etc.

A programmable hardware element (PHE) is a hardware device that includes multiple programmable function blocks connected via a system of programmable interconnects. Examples of PHEs include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores).

As used herein, the term "light" is meant to encompass within its scope of meaning any electromagnetic radiation whose spectrum lies within the wavelength range $[\lambda_L, \lambda_U]$, where the wavelength range includes the visible spectrum, the ultra-violet (UV) spectrum, infrared (IR) spectrum and the terahertz (THz) spectrum. Thus, for example, visible radiation, or UV radiation, or IR radiation, or THz radiation, or any combination thereof is "light" as used herein.

In some embodiments, a computer system may be configured to include a processor (or a set of processors) and a memory medium, where the memory medium stores program instructions, where the processor is configured to read and execute the program instructions stored in the memory medium, where the program instructions are executable by the processor to implement a method, e.g., any of the various method embodiments described herein, or, any combination of the method embodiments described herein, or, any subset of any of the method embodiments described herein, or, any combination of such subsets.

DETAILED DESCRIPTION

There are many important applications of the inversion problem, also called sparse signal recovery, of recovering $x \in \mathbb{R}^N$ from a set of undersampled linear measurements $y = \Phi x \in \mathbb{R}^M$, where $\Phi$ is an M×N measurement matrix and M<<N. In other words, sparse signal recovery is the problem of estimating a signal with few nonzero elements from a set of undersampled linear measurements. Recovering the sparsest signal from a set of undersampled linear measurements is considered to be an NP-hard problem; meaning that there is no algorithm with a polynomial runtime that could estimate the sparsest signal corresponding to a set of undersampled measurements. This problem may be ill-posed in general and more particularly, the signal x may be unrecoverable unless the signal has some type of structure such that its dimensionality can be reduced without losing information.

Compressive sensing (CS) is a special case of this problem in which the signal has a sparse representation, i.e., there exists an N×N basis matrix $\Psi=[\Psi_1|\Psi_2|\ldots|\Psi_N]$ such that $x=\Psi s$ and only K<<N of the coefficients s are nonzero (also called "sparse recovery"). Recovering the signal x from the measurements y may be effected by a sparsity-regularized convex optimization or greedy algorithm.

It can be shown that sparse recovery is equivalent to minimizing the $l_0$-norm of estimated signal, so that it is NP-hard. An alternative to $l_0$-minimization is its convex-relaxed version min $\|\hat{x}\|_1$, s.t. $y=\Phi\hat{x}$, which is the famous $l_1$-minimization problem. The promise of $l_1$-minimization in sparse signal recovery has been offset by a significant challenge. Let $\delta=M/N$ denote the undersampling ratio and $\rho=K/N$ indicate the normalized sparsity level. Accordingly, a two-dimensional phase transition plot may be constructed $(\delta,\rho)\in[0,1]^2$ that has two phases: a success phase and a failure phase where $l_1$-minimization can and cannot recover the exact signal, respectively. In other words, $l_1$-minimization may successfully recover the exact signal if its normalized sparsity level is less than a certain threshold. Since $l_1$-minimization is the relaxed version of $l_0$-minimization, it requires more measurements to recover a signal compared to $l_0$-minimization. Data comparing results addressing this problem according to conventional $l_1$-minimization techniques (the least absolute shrinkage and selection operator, or LASSO) and an embodiment presented herein (DeepInverse) are detailed below, in reference to FIG. 16. It is shown that Deepinverse significantly outperforms $l_1$-minimization from the phase transition point of view. In other words, through a set of experiments it is shown that for recovering a sparse signal, Deepinverse needs fewer measurements compared to $l_1$-minimization.

The promise of CS has been offset by two significant challenges. The first challenge is that real-world data is often not sparse in a fixed basis. It has been attempted to learn data-dependent dictionaries to sparsify signals, but the redundancy of the resulting approaches may degrade recovery performance. The second challenge is that current high-performance recovery algorithms are slow to converge, which limits CS to either non-real-time applications or scenarios where massive back-end computing is available. For example, the tradeoff for an ultrafast run time is a computationally intensive, off-line training procedure typical to deep networks that may be needed to be completed only once.

Embodiments presented herein propose a new signal recovery framework called DeepInverse that learns the inverse transformation from measurement vectors y to signals x using a deep convolutional network. When trained on a set of representative images, the network may learn both a representation for the signals x (addressing challenge one) and an inverse map approximating a greedy or convex recovery algorithm (addressing challenge two). The inverse map may be learned without having to solve a complex optimization problem, which as shown below, can significantly reduce computational time.

Experimental results shown below for exemplary embodiments indicate that the DeepInverse network may closely approximate the solution produced by state-of-the-art CS recovery algorithms, yet is hundreds of times faster in run time. A tradeoff for the ultrafast run time is a computationally intensive, off-line training procedure typical to deep networks. However, the training needs to be completed only once, which makes the approach attractive for a host of sparse recovery problems.

FIG. 1—Trained Stacked Denoising Autoencoder Using Blocky Measurements

Figure 2:
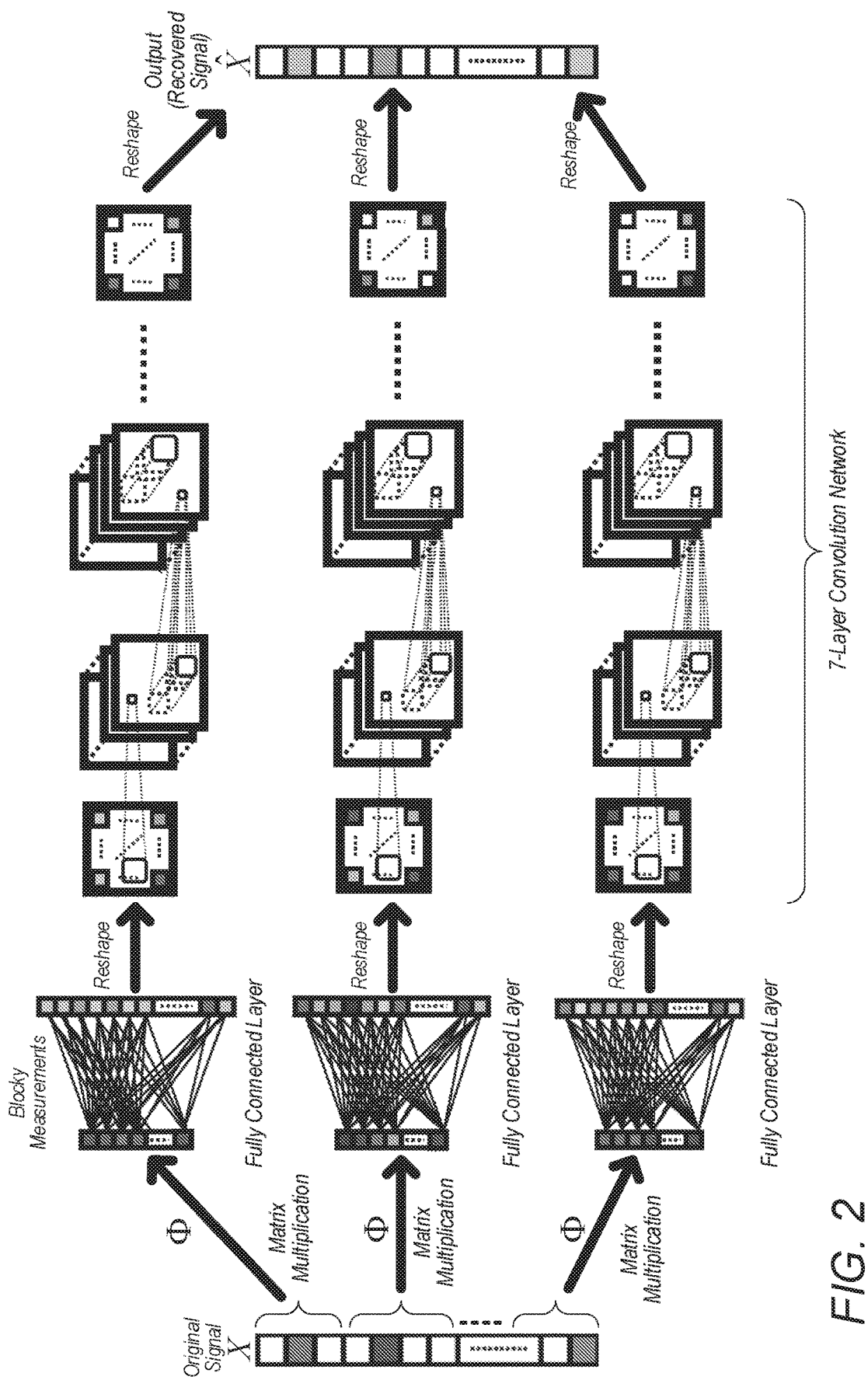
FIG. 2 illustrates a method for performing block divided signal recovery using a 7-layer convolutional neural network (CNN), according to some prior art.

FIG. 2 illustrates a method whereby previous attempts (Reference 2) to study the problem of structured signal recovery from a set of undersampled measurements used a deep learning approach, wherein a stacked denoising autoencoder (SDA) was employed as an unsupervised feature learner. A drawback of the SDA approach is that its network consists of fully-connected layers, meaning that all units in two consecutive layers are connected to each other. Because of this, as the signal size grows, so does the network. This imposes a large computational complexity on the training (backpropagation) algorithm and can also lead to overfitting. A solution to this issue was implemented in Reference 2 to divide the signal into smaller non-overlapping or overlapping blocks and then sense/reconstruct each block separately. While this approach may alleviate the computational burden of a large signal size, a blocky measurement matrix $\Phi$ is unrealistic in many applications.

FIG. 2—Blocky Recovery Using 7-Layer Convolutional Network

FIG. 2 illustrates a method whereby previous attempts (Reference 3) used a blocky measurement matrix with a fully-connected layer along with convolutional neural networks (CNNs) to recover signals from compressive measurements. Their approach also used a blocky measurement matrix $\Phi$, and is inapplicable for many data applications. Additionally, rather than employing the transpose of the measurement matrix $\Phi^T$ to obtain a signal proxy, their fully connected layer employed a training process on weight and bias functions of their zeroth layer, which greatly increases computational requirements when the original signal is large, and further introduces the potential complications of overfitting.

Embodiments presented herein improve upon prior implementations by working with arbitrary (and not just blocky, e.g., block diagonal) measurement matrices $\Phi$.

Deep Convolutional Networks

Deep Convolutional Networks (DCNs) may consist of three major layers: first, a convolutional layer that is the core of these networks. This layer may comprise a set of learnable filters with a limited receptive field that are replicated across the entire visual field and form feature maps. A second layer may comprise a rectified linear unit (ReLU) nonlinearity layer that causes nonlinearity in decision function of the overall network. A third layer may comprise a pooling layer that is a form of down-sampling and may provide translation invariance. In some embodiments, a backpropagation algorithm may be used to train the whole network and fine tune filters of convolutional layers. All three layers may play important roles in a DCNs' primary application which is image classification. In other words, in DCNs one reduces dimensionality of a given image by a series of convolutional and pooling layers in order to extract the label of that image.

In some embodiments, a Deepinverse signal recovery framework may be developed as follows. The Deepinverse framework may learn the inverse transformation from measurement vectors y to signals x using a special DCN. When trained on a set of representative images, the network may learn both a representation for the signals x and an inverse map approximating a greedy or convex recovery algorithm.

Figure 3:
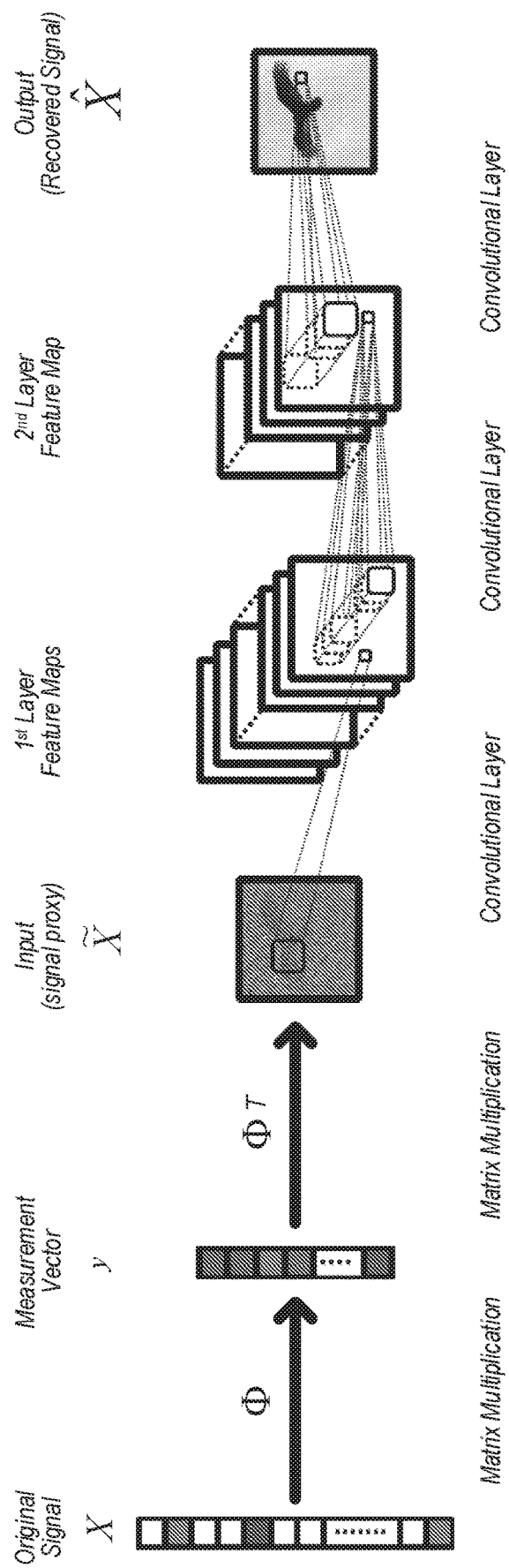
FIG. 3 illustrates a method for performing signal recovery using CNN without dividing the measurement vector into blocks, according to some embodiments of the invention.

FIG. 3—Method for Performing Signal Recovery

Figure 4:
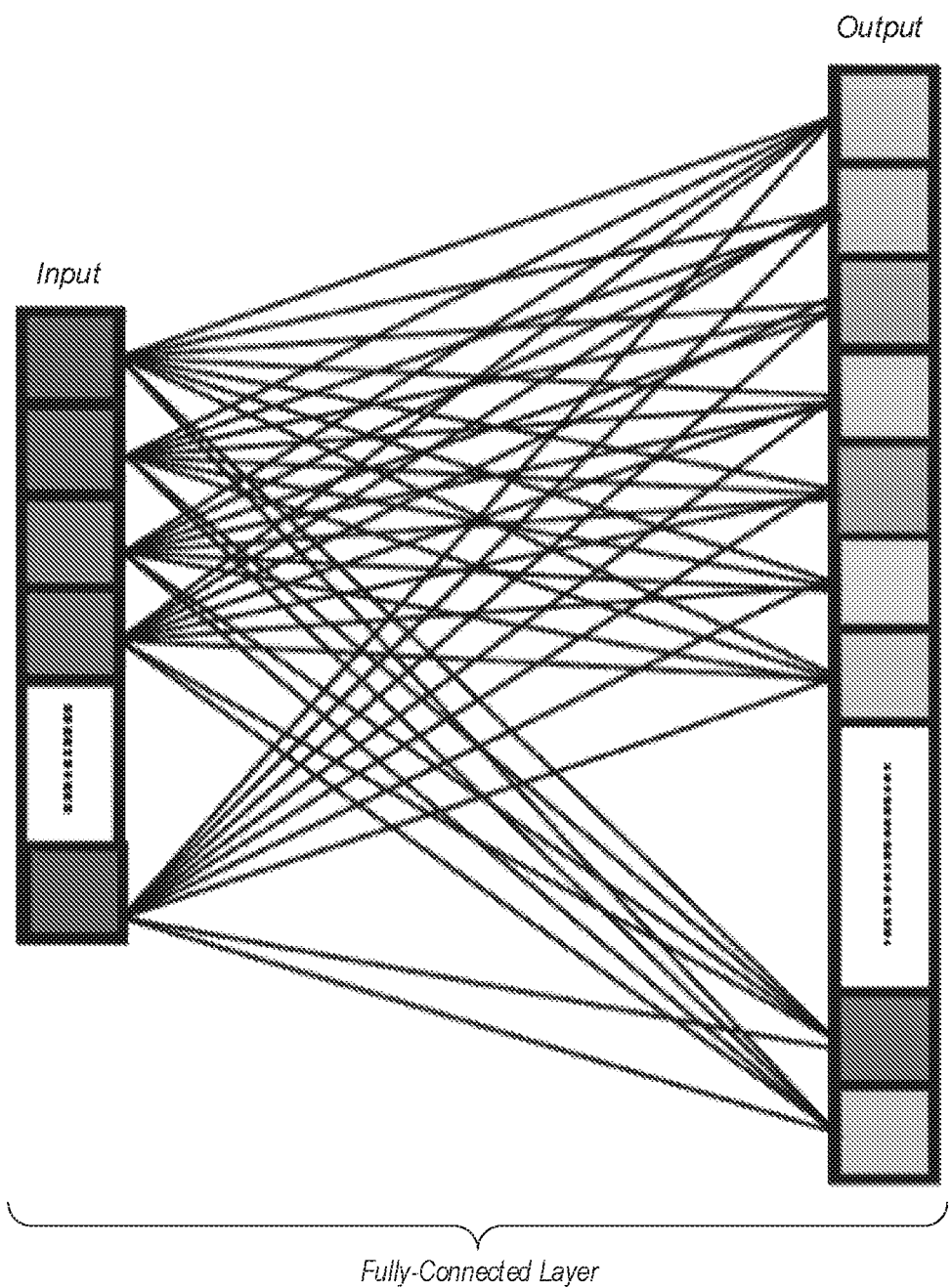
FIG. 4 illustrates an output fully connected to its input, according to some prior art.

FIG. 3 shows an exemplary method by which signal recovery is performed using a convolutional network without dividing the measurement vector into independent blocks, according to some embodiments. In these embodiments, Deepinverse may take an input (set of measurements y) in $\mathbb{R}^M$ and produce an output (signal proxy $\hat{x}$) in $\mathbb{R}^N$, where typically M<N. Accomplishing this dimensionality increase may require several modifications to the conventional DCN architecture. First, in some embodiments, to boost the dimensionality of the input from $\mathbb{R}^M$ to $\mathbb{R}^N$, a fully connected linear layer is employed. An example of a fully connected layer is given in FIG. 4. In previous implementations, the weights in this layer are trained. However, in exemplary embodiments presented herein, the weights in this (zeroth) layer may be set by implementation of the adjoint operator $\Phi^T$. The adjoint operator may be configured to operate on the entire measurement vector y, whereas previous implementations separate the measurement vector into blocks, and separately perform signal recovery on each block. Additionally, to preserve the dimensionality of the processing in $\mathbb{R}^N$, some embodiments dispense with the downsampling max-pooling operations (e.g., in ConvNets).

In some embodiments, it may be assumed that the measurement matrix $\Phi$ is fixed. Therefore, each $y_i$ ($1 \le i \le M$) may be a linear combination of $x_j$ ($1 \le i \le N$). The training set $\mathcal{D}_{train} = \{(y^{(1)}, x^{(1)}), (y^{(2)}, x^{(2)}), \ldots, (y^{(l)}, x^{(l)})\}$ may consist of l pairs of signals and their corresponding measurements.

Similarly, test set $D_{test} = \{(y^{(1)}, x^{(1)}), (y^{(2)}, x^{(2)}), \ldots, (y^{(s)}, x^{(s)})\}$ may consist of s pairs including original signals and their corresponding measurements. By training a DCN, a nonlinear mapping may be learned from a signal proxy $\tilde{x}$ to its original signal x.

In one particular embodiment described below, one fixed fully connected layer may be used (to implement $\Phi^T$), followed by three convolutional layers. The case of three convolutional layers is used here to facilitate exposition, but other numbers of layers are also possible. In some embodiments, each convolutional layer may employ batch normalization (e.g., as described in Reference 5).

In some embodiments, each convolutional layer may apply a ReLU nonlinearity to its output. The ReLU function may serve the output to zero when the output of the convolutional layer is negative, which may prevent complications in the gradient calculation during the back-propagations procedure described later. In other embodiments, the ReLU function may be replaced by a Leaky ReLU function (e.g., as described in Reference 6). Instead of setting a negative output to zero, the Leaky ReLU (L-ReLU) function may operate by multiplying this output by a factor much smaller than one (e.g., 0.01 or another factor). In other words Leaky ReLU may apply a nonlinearity to its output.

The signal proxy may be denoted by $\tilde{x}$, where $\tilde{x} = \Phi^T y$. In some embodiments, it may be assumed that $\tilde{x}$ is $n_1 \times n_2$ (where $n_1 \times n_2 = N$). Then the (i, j)-th entry of the k-th feature map in the first convolutional layer may receive $\tilde{x}$ as its input; and its output may be given by $$(x_{c1})_{i,j}^k = \mathcal{S}(\text{ReLU}((W_1^k * \tilde{x})_{i,j} + (b_1^k)_{i,j})), \quad (1)$$

where $W_1^k \in \mathbb{R}^{k_1 \times k_2}$ and $b_1^k \in \mathbb{R}^{n_1 + k_1 - 1 \times n_2 + k_2 - 1}$ denote the filter and bias values corresponding to the k-th feature map of the first layer and ReLU(x)=max(0, x). Alternatively, L-ReLU(x) may be used in place of ReLU(x) in Equation 1, wherein L-ReLU(x) may be equal to the maximum of x and a small but nonzero factor, as described above. The subsampling operator $\mathcal{S}(\bullet)$ may return the output of ReLU($\bullet$) (or L-ReLU($\bullet$)) to the original signal size by ignoring the borders created by zero-padding the input.

The feature maps of the second and third convolutional layers may be developed in a similar manner. While the filter shapes and biases may be different in the second and third layers of the network, the principles in these layers may be the same as the first layer. Let $l_1$, $l_2$, and $l_3$ denote the number of filters in the first, second, and third layers, respectively. If we denote the output of this convolutional network by $\hat{x}$ and its set of parameters by $\Omega = \{\{W_1^k, b_1^k\}_{k=1}^{l_1}, \{W_1^k, b_1^k\}_{k=1}^{l_2}, \{W_1^k, b_1^k\}_{k=1}^{l_3}\}$, then we may define a nonlinear mapping from the measurements to original signal as $\hat{x} = \mathcal{M}(y, \Omega)$.

Using the mean squared error (MSE) as a loss function over the training data $\mathcal{D}_{train}$ defined as $$\mathcal{L}(\Omega) = \frac{1}{l} \sum_{i=1}^{l} \|\mathcal{M}(y^{(i)}, \Omega) - x^{(i)}\|_2^2,$$

we can employ backpropagation (described in reference 4) in order to minimize $\mathcal{L}(\Omega)$ and learn the parameters. For fine-tuning the weights and biases, stochastic gradient descent (SGD) may be employed for minimizing the mean squared error (MSE) of the estimation of $\hat{x}$.

In some embodiments, the weight function used for a particular $k^{th}$ feature map in a particular layer may be shared between all entries in that feature map. In other words, each data point in a particular filter within a particular layer may use the same weight function. This may significantly reduce the time required to perform backpropagation, as it may drastically reduce the number of weights that need to be adjusted during backpropagation. As the size of the reference signal increases, this reduction in backpropagation time may become even more pronounced.

Figure 5:
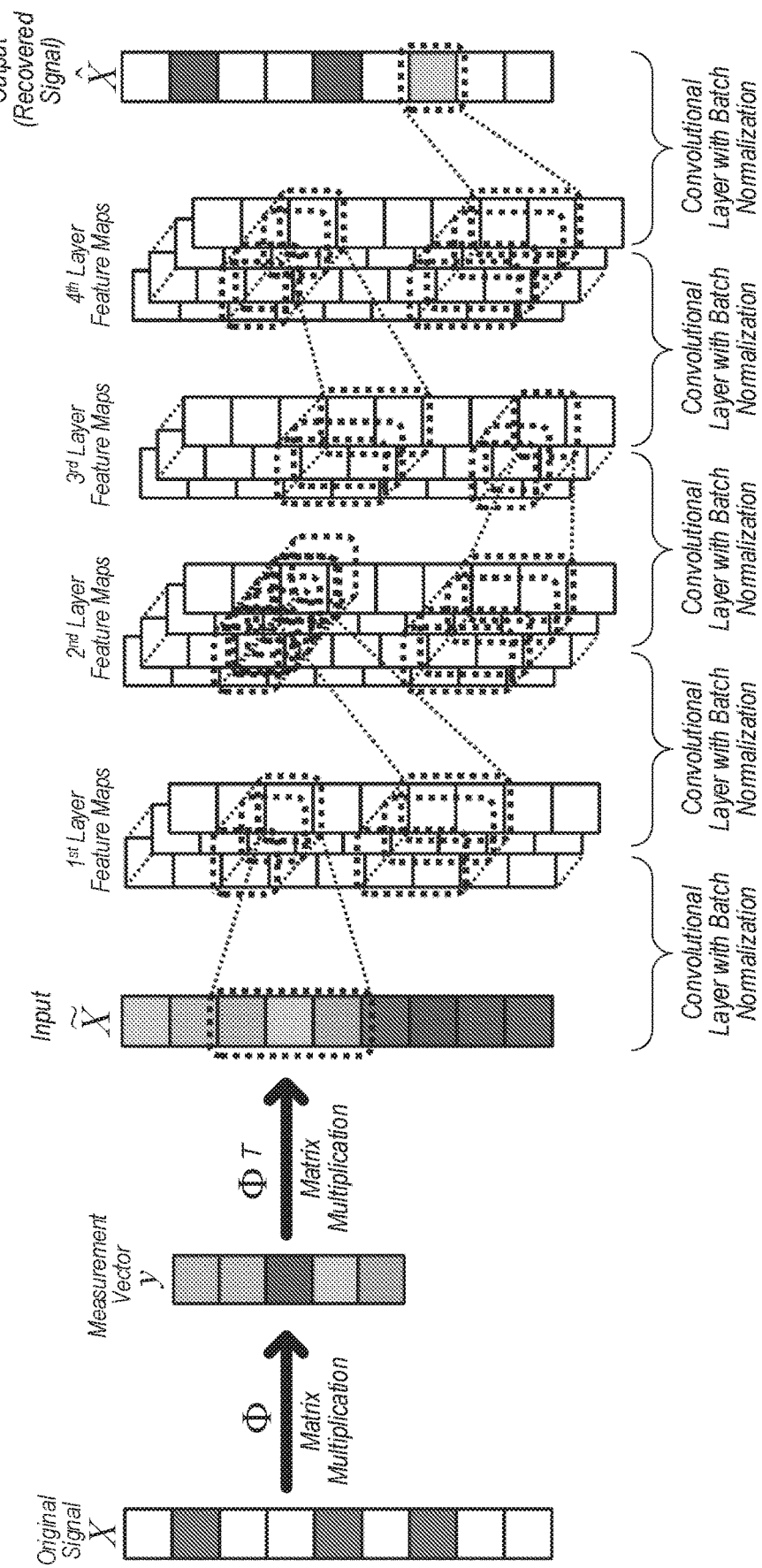
FIG. 5 illustrates a method for using a CNN with 5 convolutional layers to recover a signal using batch normalization, according to some embodiments.

FIG. 5—Five-Layer Convolutional Network with Batch Normalization

FIG. 5 shows another exemplary method by which signal recovery is performed using a convolutional network with 5 convolutional layers and employing batch normalization. In some embodiments, batch-normalization and a Leaky-ReLU are employed in conjunction with the DeepInverse framework to perform CS image recovery.

Experimental Results

In this section we describe real world results from implementations of the DeepInverse convolutional neural network (CNN) according to some embodiments of the present invention, and compare its performance to several other state-of-the-art CS recovery algorithms.

A desirable feature of some embodiments of the present invention is to use a deep learning framework to recover images from undersampled measurements without needing to divide the images into small blocks and recover each block separately. To accomplish this, in some embodiments, DeepInverse receives a signal proxy, i.e., $\tilde{x} = \Phi^T y$ (with same dimension as x) as its input. In addition, in this embodiment, DeepInverse has 3 layers with the following specifications. The first layer has 64 filters, each having 1 channel of size 11×11. The second layer has 32 filters, each having 64 channels of size 11×11. The third layer has 1 filter with 32 channels of size 11×11. Other numbers of layers, each with different numbers of filters, channels, and different channel sizes are also possible. In this embodiment, DeepInverse was trained using 64×64 cropped subimages of the natural images in the ImageNet dataset. Test images were drawn from ImageNet images that were not used for training purposes.

Figure 6:
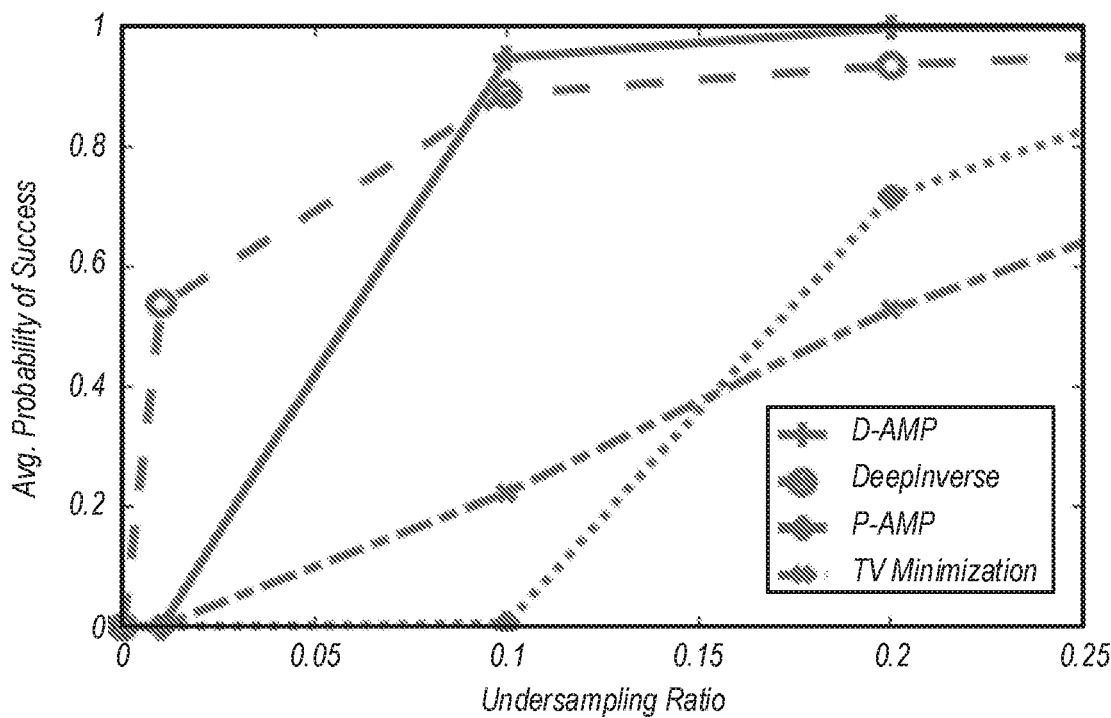
FIG. 6 is a real data plot of the average probability of successful signal recovery as a function of the undersampling ratio for state-of-the-art image recovery algorithms compared to an implemented embodiment of the invention.

FIG. 6—Average Probability of Success for Various Image Recovery Algorithms

FIG. 6 shows the plot of average probability of successful recovery for different undersampling ratios (MN) using the present embodiment of DeepInverse, as well as three different recovery algorithms: Denoising-approximate message passing (D-AMP), total variation (TV) minimization, and P-AMP. Note that we do not include any results that are specifically designed for block-based recovery. FIG. 6 compares the probability of successful recovery as measured by 2000 Monte Carlo samples. For each under-sampling ratio and Monte Carlo sample, we define the success variable $\phi_{\delta,j} = \mathbb{I}(\|\hat{x}^{(j)} - x^{(j)}\|_2^2/\|x^{(j)}\| \leq 0.1)$. For small values of undersampling ratio (e.g., 0.01), the present embodiment of DeepInverse has better performance than state-of-the-art recovery methods. However, as the undersampling ratio increases, D-AMP outperforms DeepInverse. Although FIG. 6 shows that for every undersampling ratio one method works better than others, there is not a clear winner in terms of reconstruction quality.

Figure 7:
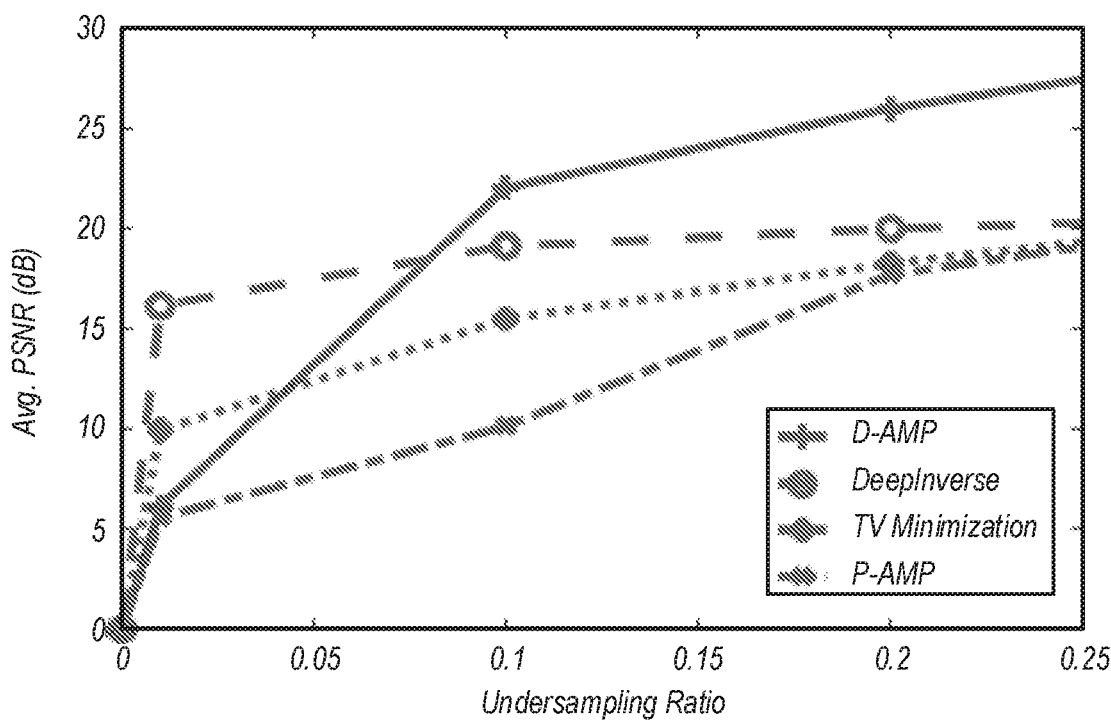
FIG. 7 is a real data plot of the average peak signal-to-noise ratio (PSNR) as a function of the undersampling ratio for state-of-the-art image recovery algorithms compared to an implemented embodiment of the invention.

FIG. 7—Peak Signal-to-Noise Ratio (PSNR) for Various Image Recovery Algorithms

FIG. 7 compares the average peak signal-to-noise ratio (PSNR) of the Monte Carlo test samples for different undersampling ratios and algorithms. Again, for small values of undersampling ratio (e.g., 0.01), the present embodiment of DeepInverse has better performance than state-of-the-art recovery methods.

Figure 8:
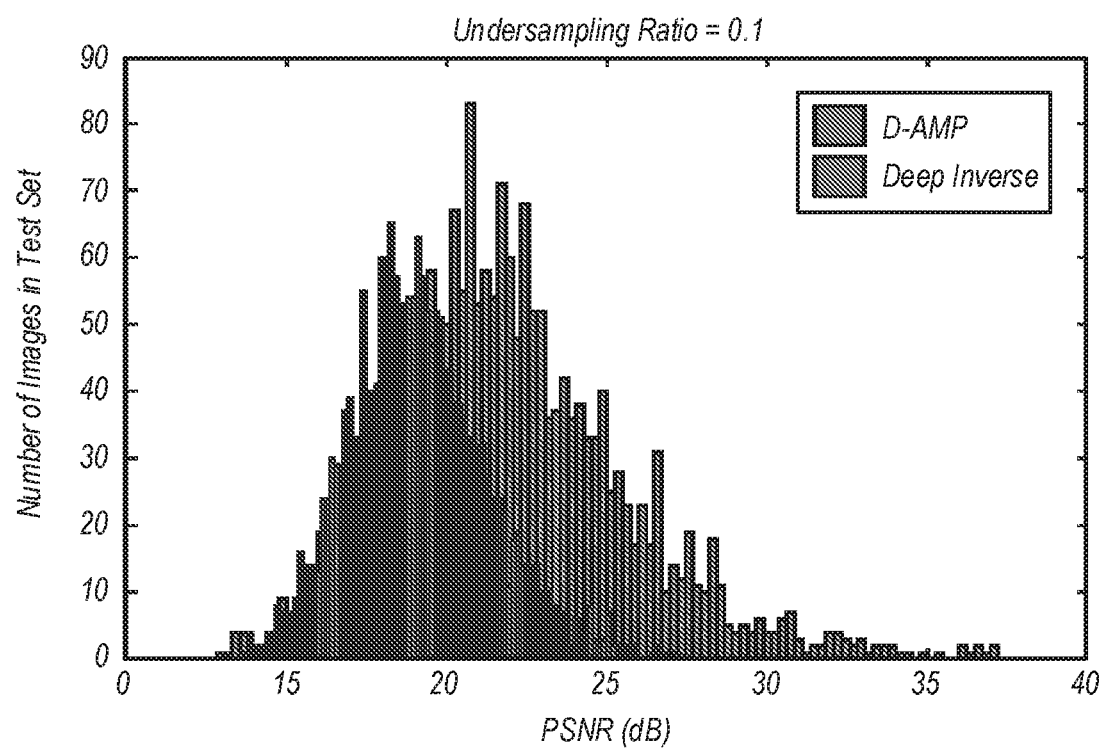
FIG. 8 shows two real data histograms of the number of images with a given peak signal-to-noise ratio (PSNR) for two undersampling ratios for a denoising-approximate message passing (D-AMP) algorithm compared to an implemented embodiment of the invention.
Figure 8:
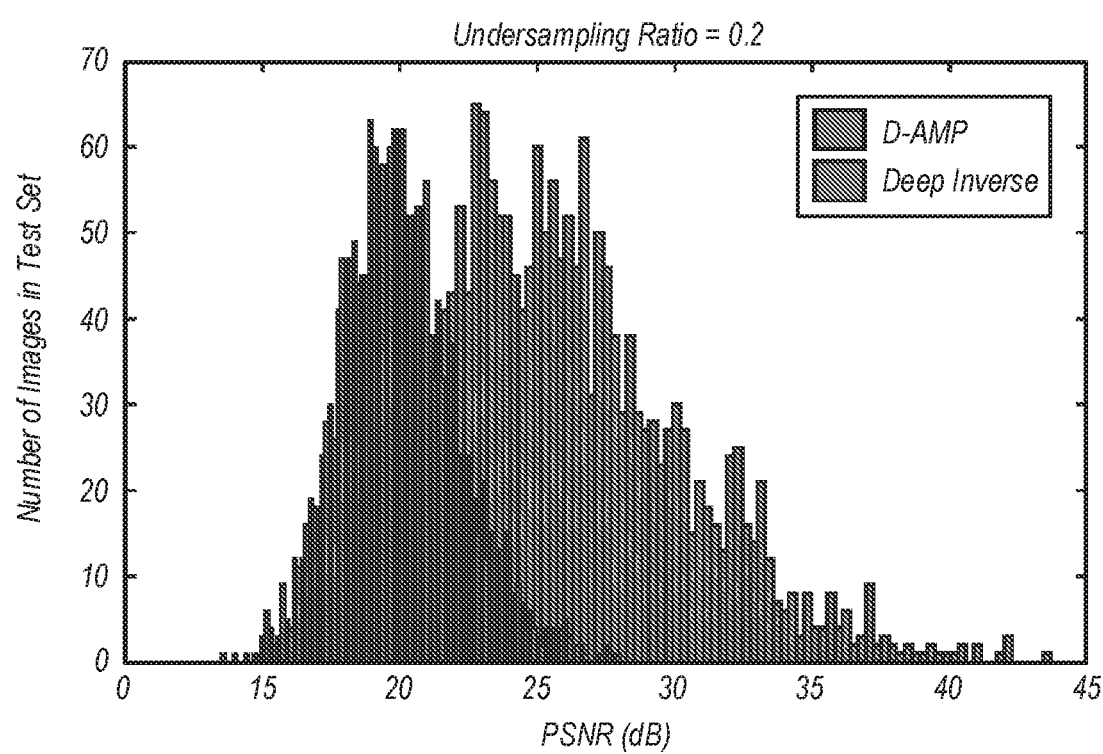

FIG. 8—Histogram of PSNR for Various Image Recovery Algorithms

FIG. 8 shows the histograms of the PSNRs of the recovered test images, indicating that DeepInverse outperforms D-AMP for some images in the test set, for the present embodiment.

TABLE 1

Average reconstruction time of test set images for different sampling rates and algorithms.

| | Reconstruction Time (s) | | | |
|---|---|---|---|---|
| M/N | DeepInverse | D-AMP | TV | P-AMP |
| 0.2 | 0.01 | 3.41 | 2.53 | 1.53 |
| 0.1 | 0.01 | 2.93 | 2.34 | 1.23 |
| 0.01 | 0.01 | 2.56 | 2.26 | 0.94 |

While FIGS. 6 and 7 indicate that DeepInverse offers recovery probability and PSNR performance that is comparable to state-of-the-art CS recovery algorithms, Table 1 shows that DeepInverse has a run time that is a tiny fraction of current algorithms. As a result, DeepInverse may be especially suitable for applications that need low-latency recovery.

Figure 9:
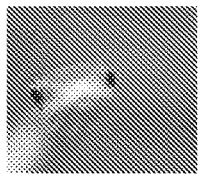
FIG. 9 is a table comparing real data for image recovery according to a denoising-approximate message passing (D-AMP) algorithm and an implemented embodiment of the invention.

FIG. 9—Comparison of Best and Worst Results from DAMP and DeepInverse

FIG. 9 plots the images recovered by DeepInverse and D-AMP when they are on their best and worst behavior.

TABLE 2

Effect of noise on average PSNR (dB) of reconstructed test images for D-AMP and DeepInverse (undersampling ratio = 0.1). We added 20 dB noise to images of test set. Due to noise-folding, the variance of the noise that we observe after the reconstruction is larger than the input noise.

| | Noiseless Measurements | Noisy Measurements |
|---|---|---|
| D-AMP | 22.06 | 21.14 |
| DeepInverse | 19.14 | 18.70 |

Table 2 shows the effect of adding input noise on recovery performance of D-AMP and DeepInverse. For undersampling ratio of 0.1 and 20 dB input noise, DeepInverse is more robust to noise comparing to D-AMP in the present embodiment.

Figure 10:
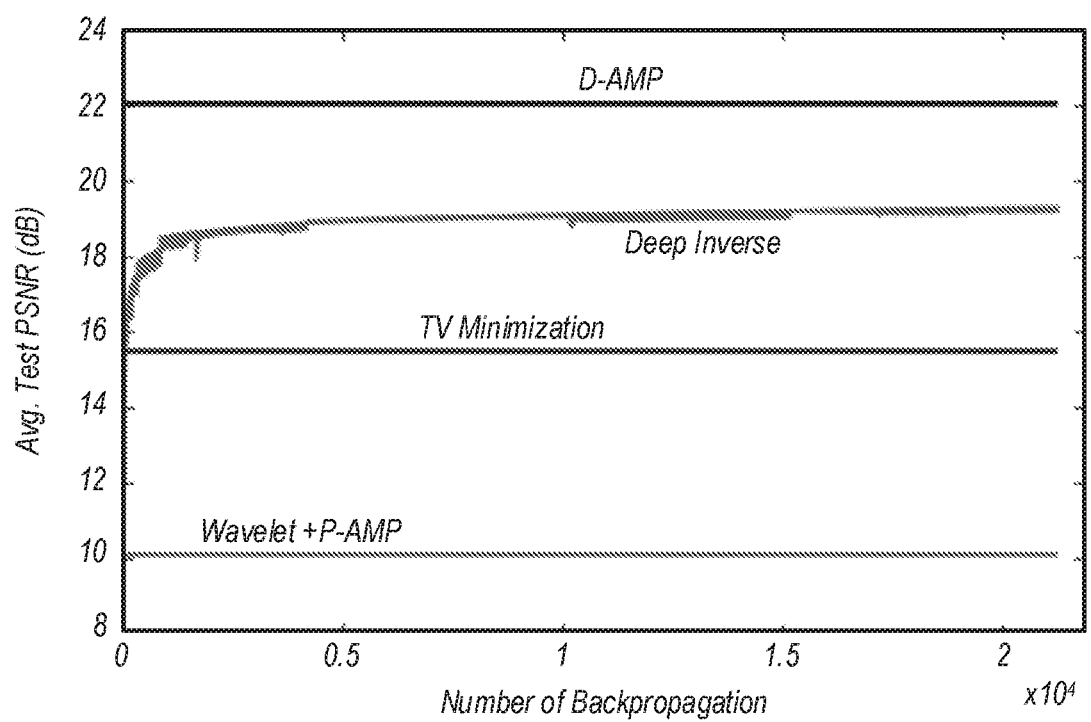
FIG. 10 is a real data plot showing the convergence of average test peak signal-to-noise ratio (PSNR) for the backpropagation training algorithm over different iterations for state-of-the-art image recovery algorithms compared to an implemented embodiment of the invention.

FIG. 10—Convergence of Test PSNR for Various Image Recovery Algorithms

FIG. 10 shows the convergence of the back-propagation training algorithm over different iterations for DeepInverse. It also shows the average PSNR of the images in the test dataset for different methods with M/N=0.1. It can be seen that after several iterations, DeepInverse starts to outperform TV minimization and P-AMP.

Accelerometer Data+Gaussian Measurement Matrix

Here we present real data from another embodiment regarding a wearable accelerometer mounted on the. In this embodiment, the DeepInverse framework receives a signal proxy, i.e., $\tilde{x} = \Phi^T y$ which has the same dimension as its original signal, i.e., x. For the accelerometer dataset, in this embodiment DeepInverse was used with the following specifications:

The convolutional network has 5 layers.
First layer has 32 filters each having 1 channel of size 1×61.
Second layer has 16 filters each having 32 channels of size 1×61.
Third layer has 32 filters each having 16 channels of size 1×61.
Fourth layer has 16 filters each having 32 channels of size 1×61.
Fifth layer has 1 filters that has 16 channels of size 1×61.

In this embodiment, the training data includes 30,000 signal samples and their corresponding proxies while the test data contains 8427 signal samples and their corresponding proxies. The length of both signal samples and their corresponding proxies are 128. The undersampling rate in this simulation is 0.4. In addition, the measurement matrix 1 is a random Gaussian matrix having independent and identically distributed (i.i.d.) Gaussian elements with zero mean and a standard deviation of 0.02. In this embodiment, the performance of DeepInverse is compared with an approximate message passing (AMP) algorithm for this signal recovery problem.

TABLE 3

Comparison of DeepInverse and AMP performance for accelerometer signal recovery.
DeepInverse is 180 times faster than AMP on average.

| | DeepInverse | AMP |
|---|---|---|
| MSE | 0.1787 | 0.3732 |
| NMSE | 0.0023 | 0.0048 |
| Reconstruction Time (s) | 0.0005 | 0.09 |

Table 3 compares the performance of DeepInverse with AMP for the accelerometer test dataset. It includes comparison of mean squared error (MSE), normalized mean squared error (NMSE), and reconstruction time. It can be seen that DeepInverse beats AMP in all the aspects. Specifically, the DeepInverse recovery is 180 times faster than the AMP recovery.

Figure 11:
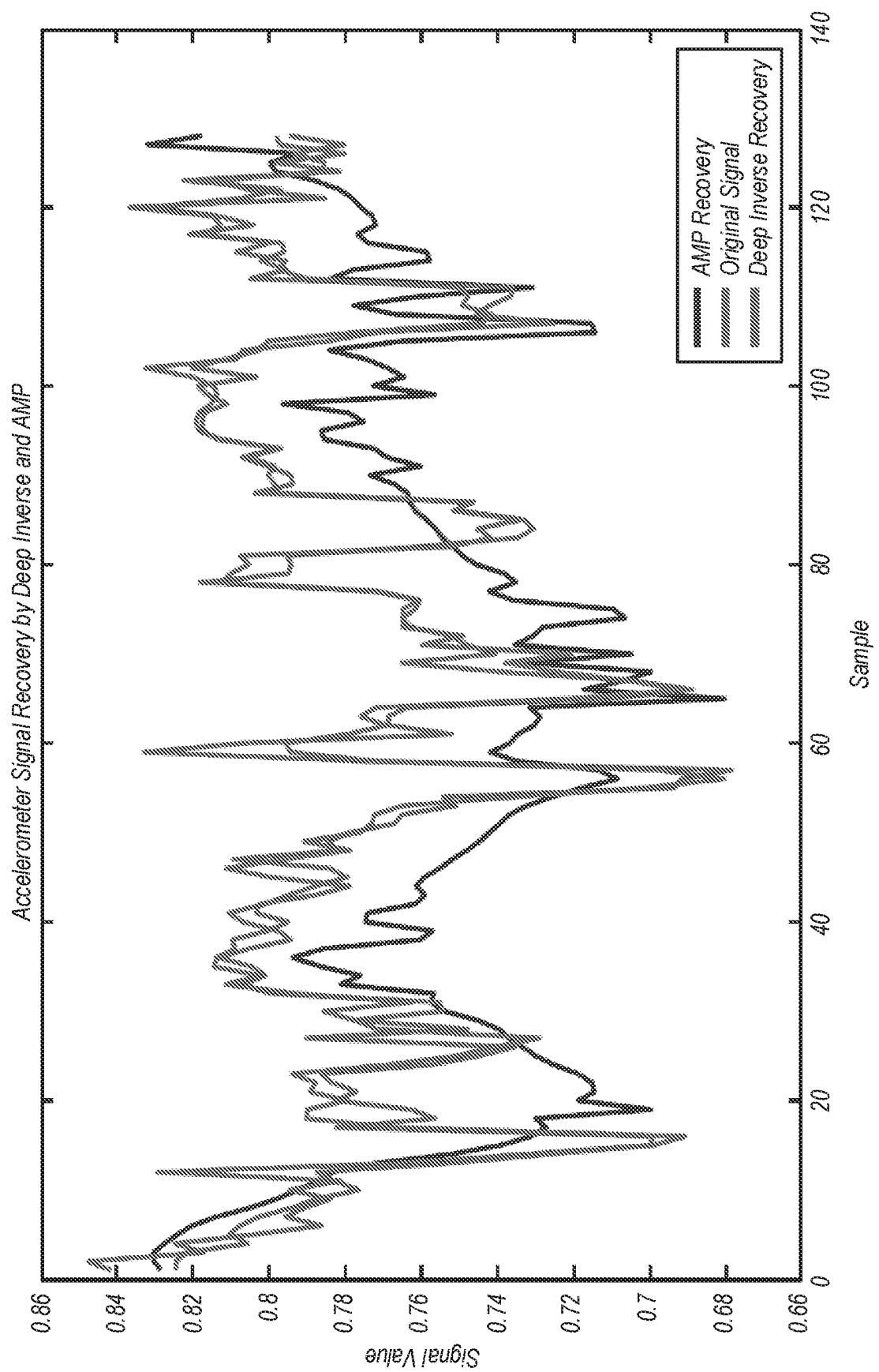
FIG. 11 is a real data plot of accelerometer signal recovery using an approximate message passing (AMP) algorithm compared to an implemented embodiment of the invention with an undersampling ratio of 0.4.

FIG. 11—Accelerometer Signal Recovery for AMP and DeepInverse Recovery Algorithms FIG. 11 shows an example of accelerometer signal recovery using DeepInverse framework and AMP algorithm. In addition, FIG. 6 shows the test MSE of DeepInverse method in different epochs of training, wherein DeepInverse has outperformed AMP only after 9 epochs of training.

Figure 12:
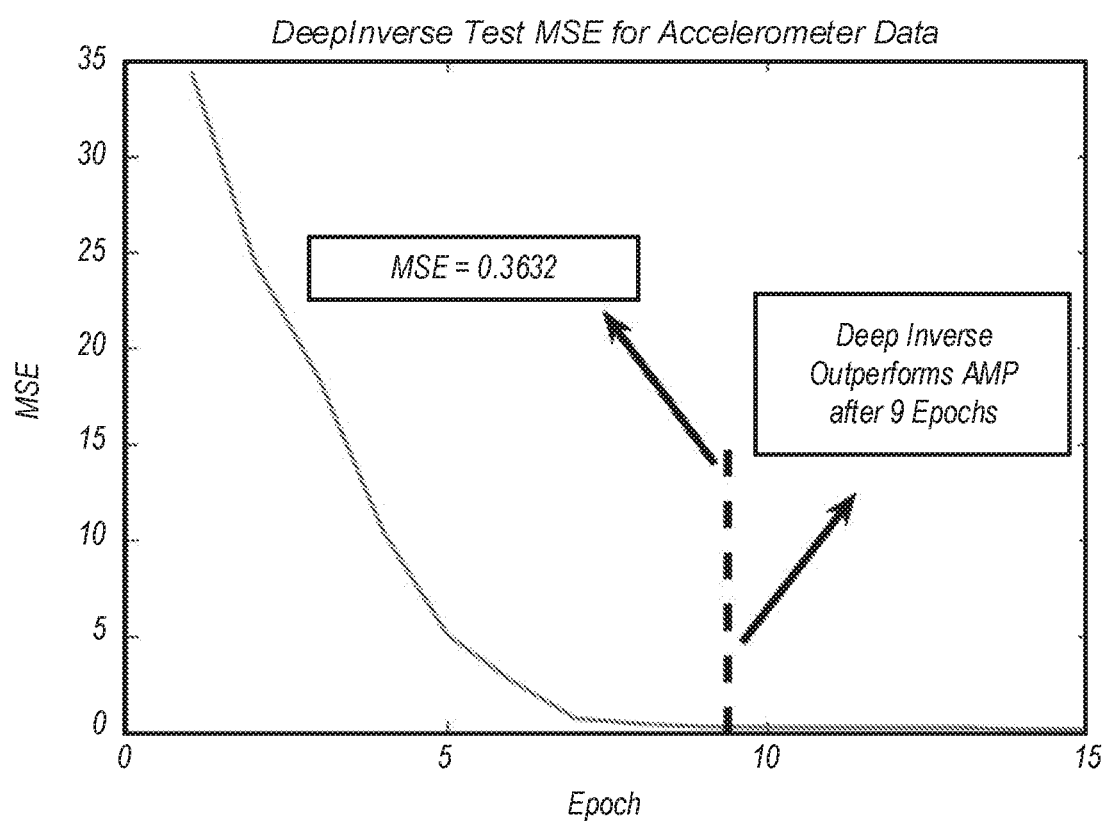
FIG. 12 is a real data plot comparing test mean square error (MSE) in different epochs for an implemented embodiment of the invention compared to an approximate message passing (AMP) algorithm.

FIG. 12—Accelerometer Test MSE for AMP and DeepInverse Recovery Algorithms

FIG. 12 shows DeepInverse test MSE in different epochs and its comparison to AMP. This plot shows that after short amount of training DeepInverse achieves the performance of AMP and starts to outperform it.

CIFAR Data+Fourier Sampling

In another embodiment, the DeepInverse framework is applied to the case of magnetic resonance imaging (MM). This section presents signal recovery for this application. In MM the number of measurements is proportional to the scan time. Therefore, using compressive sensing will allow for a shorter scan time. Furthermore, using DeepInverse framework will allow for ultra-fast image recovery once measurements are taken. Since the measurement matrix in MRI compressive sensing is a Fourier matrix, Fourier sampling is focused on in this simulation and it is shown that DeepInverse works with Fourier sampling as well. The performance of DeepInverse is compared with a signal recovery algorithms used for MRI compressive sensing called projection on convex sets (POCS) algorithm.

In this embodiment, DeepInverse is used with the following specifications:

The convolutional network has 5 layers.

First layer has 32 filters each having 1 channel of size 11×11.

Second layer has 16 filters each having 32 channels of size 11×11.

Third layer has 32 filters each having 16 channels of size 11×11.

Fourth layer has 16 filters each having 32 channels of size 11×11.

Fifth layer has 1 filter that has 16 channels of size 11×11.

In this embodiment, the training data includes 200,000 signal samples and their corresponding proxies while the test data contains 40,000 signal samples and their corresponding proxies. Signals are image patches of size 16×16 and their corresponding proxies have the same size. The undersampling ratio in this simulation is 0.3.

Figure 13:
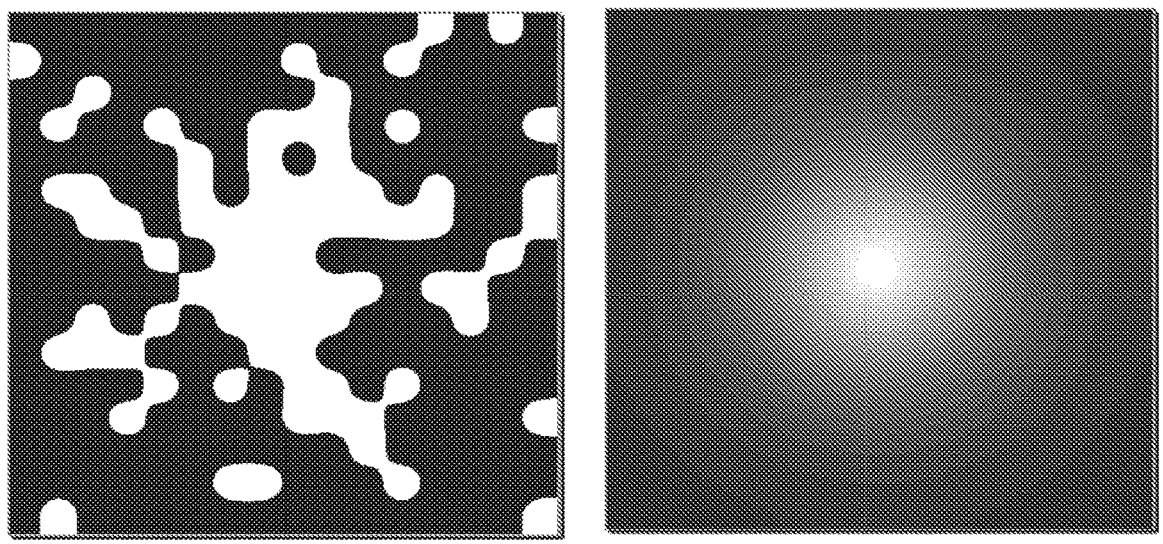
FIG. 13 shows (on the left) a variable-density random sampling mask, and (on the right) the probability distribution from which the random sampling mask is derived, according to some embodiments.

FIG. 13—Variable-Density Random Mask and Corresponding Probability Distribution

In FIG. 13, the left image denotes the sub-sampling operator which is a variable-density random mask, drawn from a probability distribution given by the right image.

TABLE 4

Comparison of DeepInverse and Projections onto convex sets (POCS) performance for image recovery from Fourier-sampled measurements. DeepInverse is 100 times faster than POCS on average.

|  | DeepInverse | POCS |
| --- | --- | --- |
| MSE | 0.5945 | 0.603 |
| NMSE | 0.0353 | 0.0401 |
| Reconstruction Time (s) | 0.003 | 0.3 |

Table 4 shows the performance of DeepInverse and Projections onto convex sets (POCS) for Fourier-sampled test dataset. As shown, DeepInverse has a better performance than POCS in all aspects. Specifically, DeepInverse recovery is 100 times faster than POCS recovery for the Fourier-sampled dataset.

Figure 14:
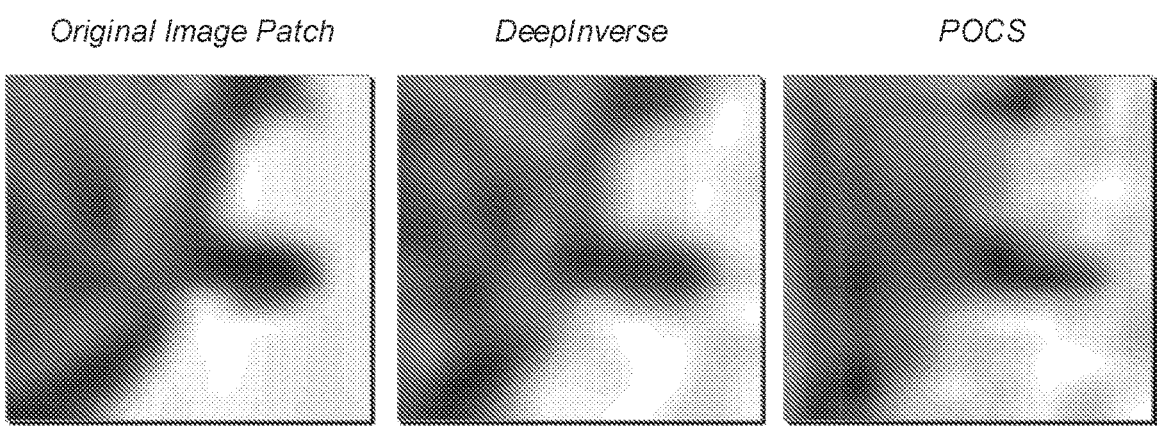
FIG. 14 shows real data for image patch recovery using a projection onto convex sets (POCS) algorithm compared to an implemented embodiment of the invention with an undersampling ratio of 0.3.

FIG. 14—Image Patch Recovery for DeepInverse and POCS Algorithms

FIG. 14 shows an example of image patch recovery using the presently implemented DeepInverse framework and the POCS algorithm when the undersampling ratio is 0.3. It is shown that the DeepInverse reconstruction has a better quality.

Figure 15:
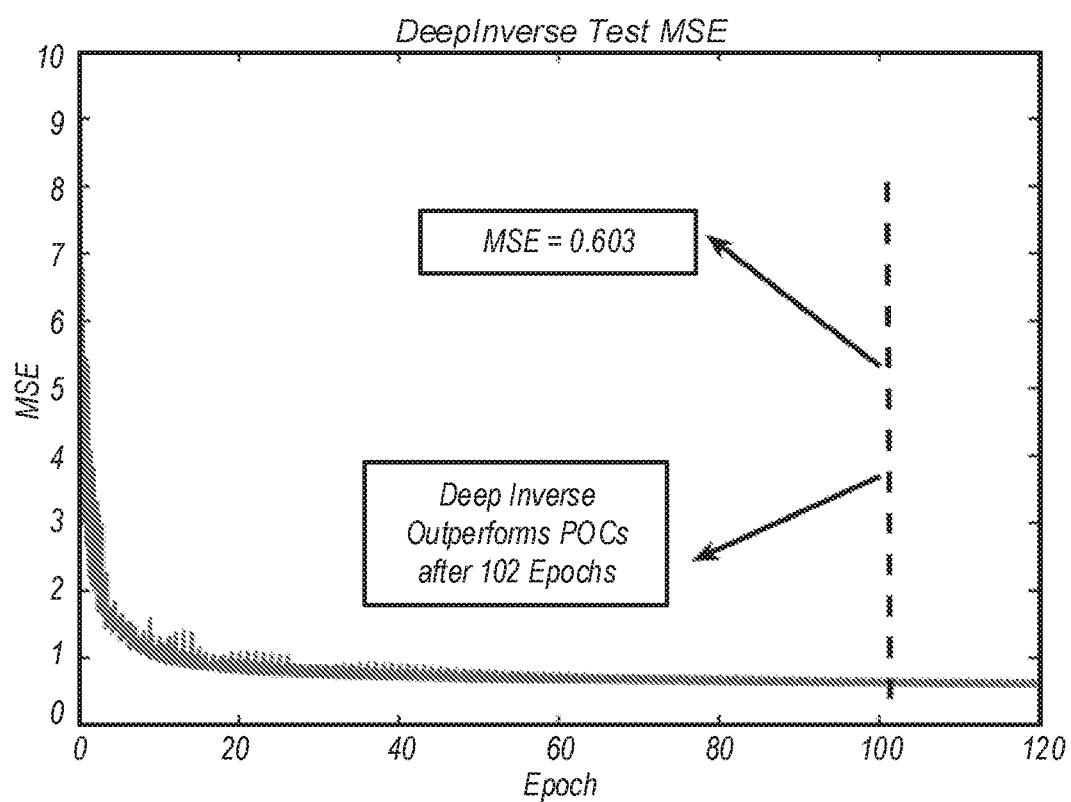
FIG. 15 is a real data plot comparing test mean square error (MSE) in different epochs for an implemented embodiment of the invention compared to a projection onto convex sets (POCS) algorithm.

FIG. 15—Test MSE for DeepInverse in Different Epochs

FIG. 15 shows the test mean-square error (MSE) of DeepInverse method in different epochs, wherein it is shown that DeepInverse starts to outperform POCS after 102 epochs of training.

Figure 16:
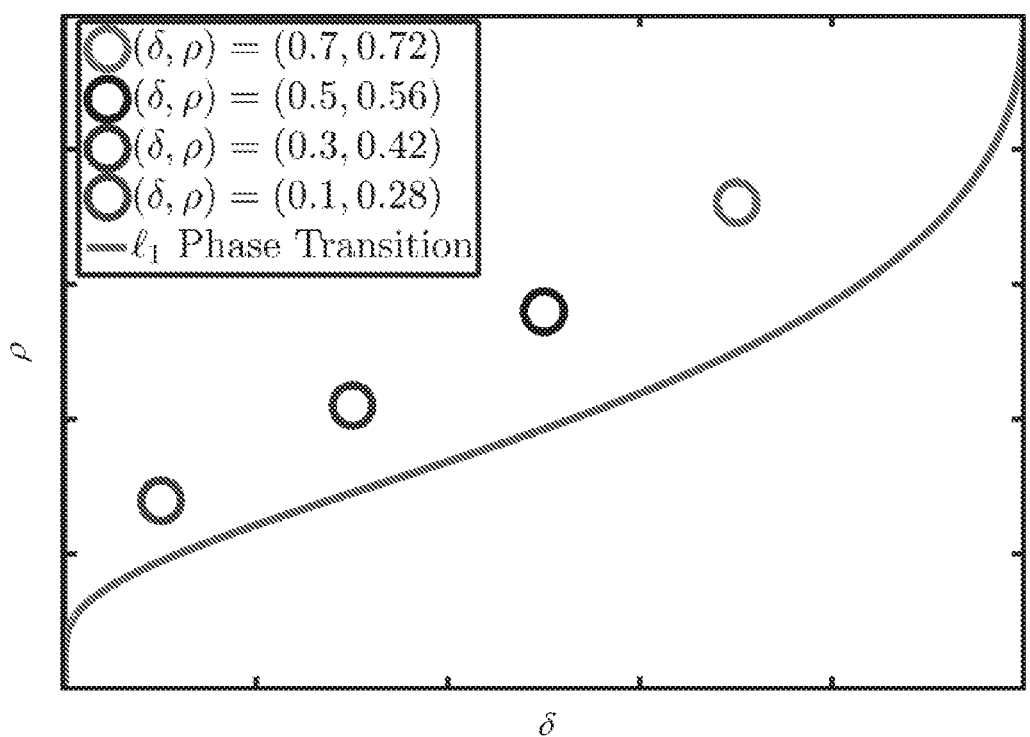
FIG. 16 illustrates a performance comparison of the least absolute shrinkage and selection operator (LASSO) methodology to an implemented embodiment of the invention.
Figure 17:
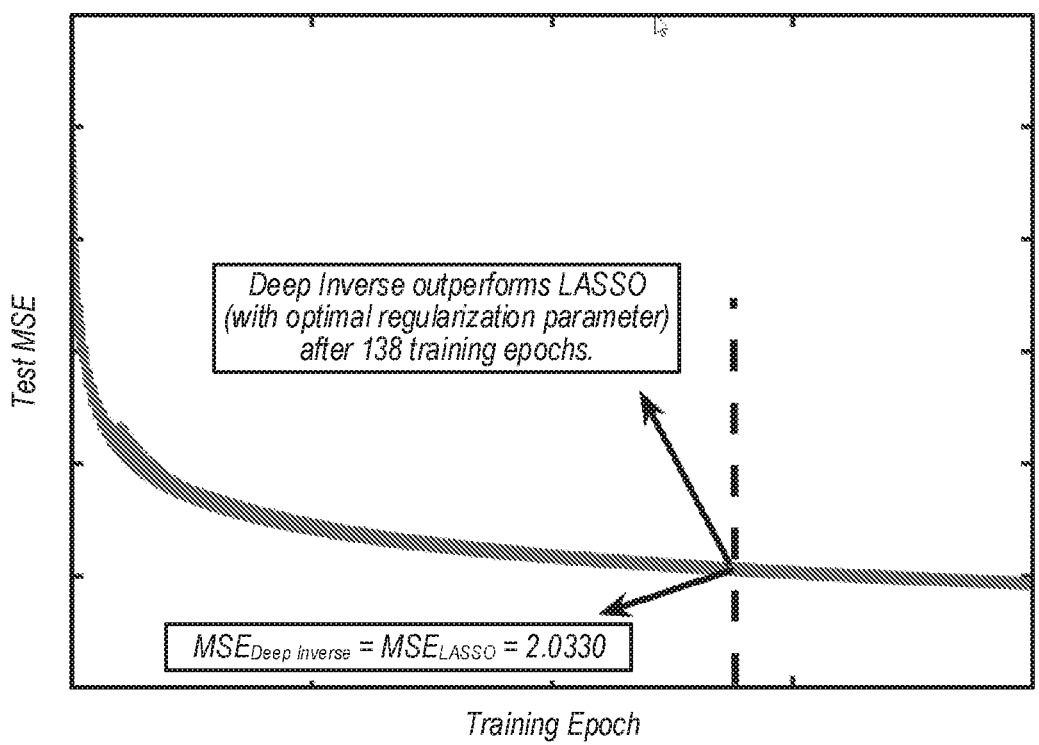
FIG. 17 illustrates a performance comparison of the test MSE for the LASSO methodology and an implemented embodiment of the invention.
Figure 18:
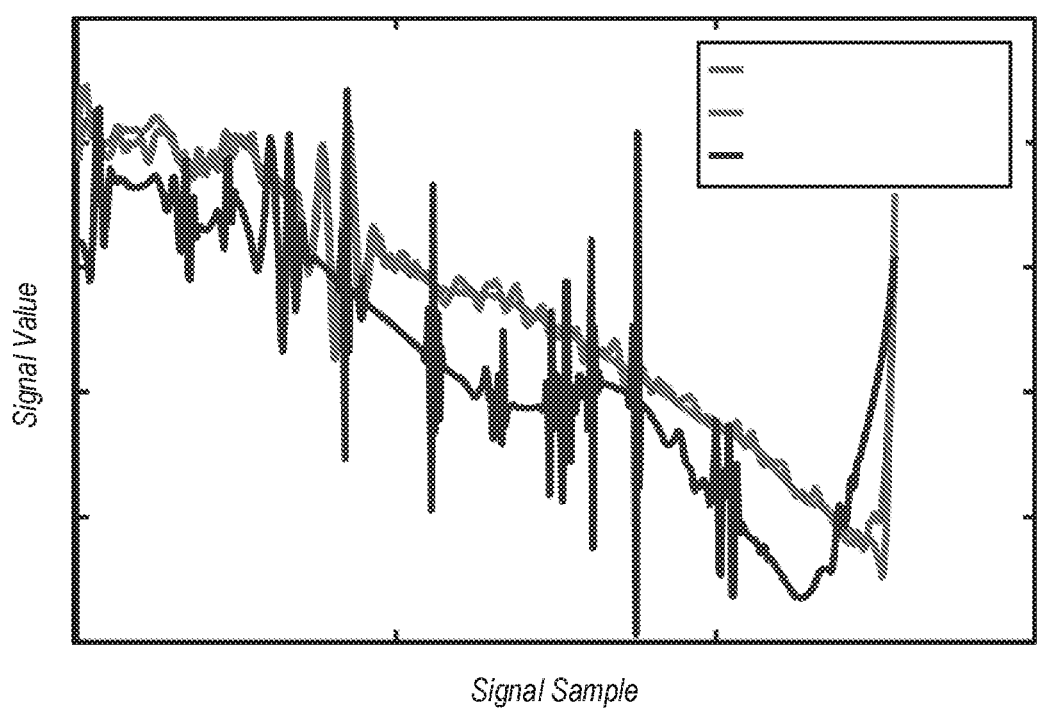
FIG. 18 illustrates signal recovery results using each of LASSO and an implemented embodiment of the invention.

FIGS. 16-18—Comparison of DeepInverse and LASSO

FIG. 16 illustrate the results of various (δ,ρ) test configurations of DeepInverse as compared to the $l_1$ phase transition. Circles in FIG. 16 denote the problem instances, i.e., (δ,p) on which we have compared DeepInverse performance with the least absolute shrinkage and selection operator (LASSO). The performance of implementation of DeepInverse is compared to LASSO over a grid of regularization parameters. In this embodiment, DeepInverse network has five layers. The first and third layers have 32 filters, each having 1 and 16 channels of size 125, respectively. The second and fourth layers have 16 filters, each having 32 channels of size 125. Finally, the fifth layer has 1 filter that has 16 channels of size 125. DeepInverse was tested and trained using wavelet sparsified version of 1D signals of size 512 extracted from rows of CIFAR-10 images. In this example, the training set has 100,000 signals and the test set has 20,000 signals. FIG. 17 shows the test mean square error (MSE) of the DeepInverse method in different training epochs, according to one embodiment. FIG. 18 shows an example of signal recovery using DeepInverse framework and LASSO.

TABLE 5

Average reconstruction time (S.) of test set signals. DeepInverse is hundreds of times faster than LASSO.

| (δ, ρ) | DeepInverse | LASSO |
| --- | --- | --- |
| (0.1, 0.28) | 0.003 | 0.0274 |
| (0.3, 0.42) | 0.003 | 0.0675 |
| (0.5, 0.56) | 0.003 | 0.0450 |
| (0.7, 0.72) | 0.003 | 0.0570 |

Table 5 shows the average reconstruction time of the test set signals for both methods. Note that in all the experiments it is assumed that the optimal regularization parameter of LASSO is given by an oracle.

TABLE 6

Average normalized mean squared error (NMSE) of test set signals.
DeepInverse outperforms the LASSO in all the cases.

| (δ, ρ) | DeepInverse | LASSO |
|---|---|---|
| (0.1, 0.28) | 0.0109 | 0.0428 |
| (0.3, 0.42) | 0.0150 | 0.0466 |
| (0.5, 0.56) | 0.0122 | 0.0312 |
| (0.7, 0.72) | 0.0114 | 0.0164 |

Table 6 shows the average normalized mean squared error (NMSE), i.e., $\|\hat{x}-x\|_2^2/\|x\|_2^2$ of the test set signals. As can be seen in Table 1 and 2, Deepinverse outperforms LASSO (with the optimal regularization parameter) in all the configurations determined in FIG. 16.

Figure 19:
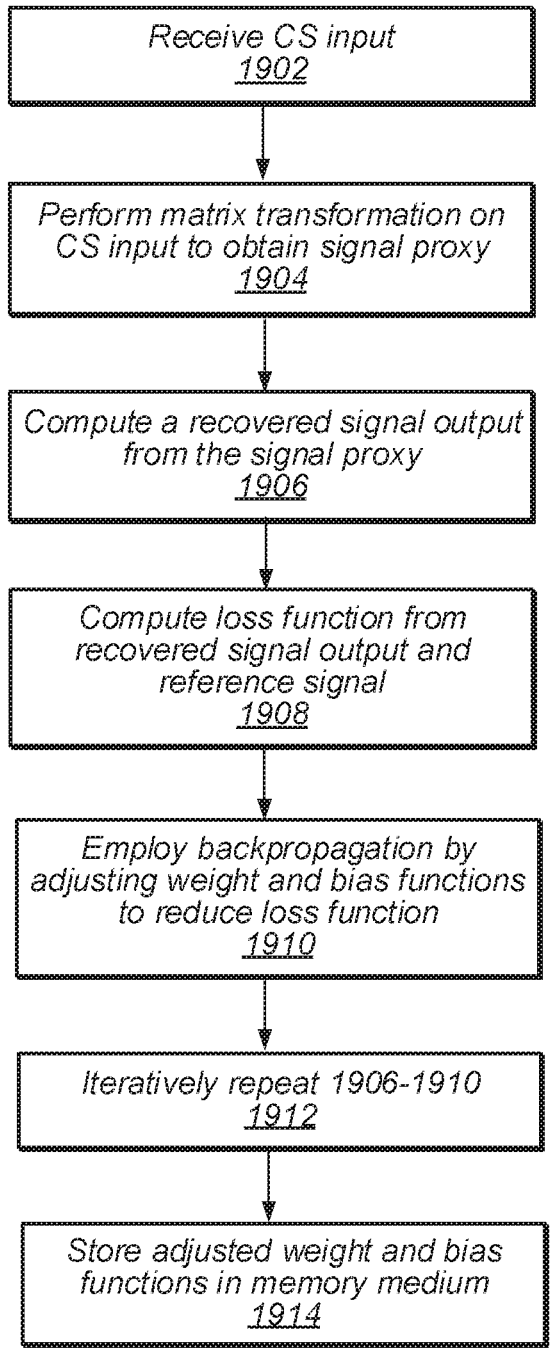
FIG. 19 is a flow chart diagram illustrating a method for training a convolutional neural network to perform compressive sensing imaging, according to some embodiments.

FIG. 19—Training the CNN to Perform CS Signal Recovery

FIG. 19 is a flowchart diagram illustrating a method for training a convolutional neural network (CNN) to perform signal recovery, according to some embodiments. In some embodiments, the following method steps may be performed by a processing element coupled to a memory medium.

At 1902, compressive sensing (CS) input may be received that comprises a measurement vector of a reference signal. In various embodiments, the reference signal may be any of a variety of types of images or other signals. For example, the reference signal may be an image of a person or a biological organism, an X-Ray image, a magnetic resonance imaging (MRI) image, a computerized tomography (CT) scan image, or a hyperspectral image. In other embodiments, the CNN may perform signal recovery on another type of signal, such as a radar signal, a speech signal, a seismic signal, accelerometer data, or a wireless communication signal. In general, the size and dimension of the measurement vector may vary depending on the specific application. Additionally, the adjoint operator applied to obtain the signal proxy (described in detail below in reference to step 1904) may also vary in size and dimension depending on the specific application.

At 1904, a matrix transformation may be performed on the CS input to obtain a signal proxy, wherein the signal proxy comprises a zeroth layer of the CNN. The matrix transformation may not act separately on blocks of the CS input, such that the matrix transformation may not be a block diagonal matrix transformation. Rather, in some embodiments, the matrix transformation may act on the entirety of the CS input, thus allowing for recovery of signals in applications where signals cannot be divided in smaller blocks (or effectively divided, e.g., without damaging the fidelity of the signal). One example of an application with this property is MM, which uses a Fourier matrix to take measurements of a signal, although other examples are also possible.

The matrix transformation may involve applying an adjoint operator onto the CS input, to obtain a signal proxy that is the same size and dimension as the reference signal. For example, the adjoint operator (e.g., the operator $\Phi^T$ described above) may be an adjoint matrix to the matrix used to obtain the measurement vector from the reference image (e.g., the measurement operator $\Phi$). The application of an adjoint operator to the CS input may advantageously produce a signal proxy that may be subsequently used to train the CNN without having to expend time and computational resources to train weights and bias functions associated with the zeroth layer of the CNN. The computational complexity of the CNN process increases significantly with the number of weight and bias functions in each layer, such that the application of an adjoint operator to obtain the signal proxy (e.g., in contrast to training weight and bias functions to obtain the zeroth layer of the CNN) may significantly decrease the computational requirements associated with training and employing the CNN. Additionally, training parameters of the zeroth layer may lead to overfitting of the recovered signal, which is advantageously avoided by application of the adjoint operator.

At 1906-1912, as described in further detail below, the CNN may be trained using the signal proxy and the reference input.

At 1906, a recovered signal output may be computed from the signal proxy. The recovered signal output may be advantageously obtained without running an optimization-based algorithm. The recovered signal output may be computed by processing the signal proxy at each of a plurality of subsequent layers of the CNN. The subsequent layers of the CNN may each be associated with respective filters, channels, weight functions, and bias functions. In some embodiments, a final subsequent layer may contain a single filter that produces a single feature map that constitutes the recovered signal output.

In some embodiments, processing the signal proxy at each of the plurality of subsequent layers of the CNN may involve applying a Leaky ReLU function to outputs of the weight and bias functions. In some embodiments, processing the signal proxy at each of a plurality of subsequent layers of the CNN comprises, for each filter within a respective layer, applying the same weight function to each data point. In some embodiments, each subsequent layer employs batch normalization. A more detailed description of how the recovered signal output may be computed from the signal proxy is given, e.g., in the description of FIG. 21, below.

At 1908, a loss function may be computed based at least in part on a comparison of the recovered signal output to the reference signal. For example, the loss function may comprise a quantitative measure of the difference between the recovered signal output and the reference signal.

At 1910, backpropagation may be employed. Backpropagation may involve adjusting the weight and bias functions to reduce the loss function in a subsequent computation of the recovered signal output. In other words, backpropagation may involve adjusting weight and bias functions associated with subsequent layers of the CNN based on calculations involving the signal proxy, as variously described above.

At 1912, each of steps 1906-1910 may be repeated, to iteratively improve the weight and bias functions (e.g., by further reducing the loss function). In some embodiments, 1906-1910 may be iteratively repeated until the loss function is reduced below a predetermined threshold. In other embodiments, 1906-1910 may be iteratively repeated a predetermined number of times. In some embodiments, the number of repetitions may be determined based on the size of one or more of the CS input or the signal proxy.

At 1914, subsequent to a final repetition of 1906-1910, the final adjusted weight and bias functions may be stored in the memory medium, to obtain a trained CNN. The final adjusted weight and bias functions may be subsequently used by the trained CNN to perform signal recovery. In some embodiments, and as described in further detail in reference to FIG. 20, subsequent to training the CNN, the trained CNN may be used to compute and output a recovered image from CS input. The CS input may have a smaller dimension than the recovered image.

Figure 20:
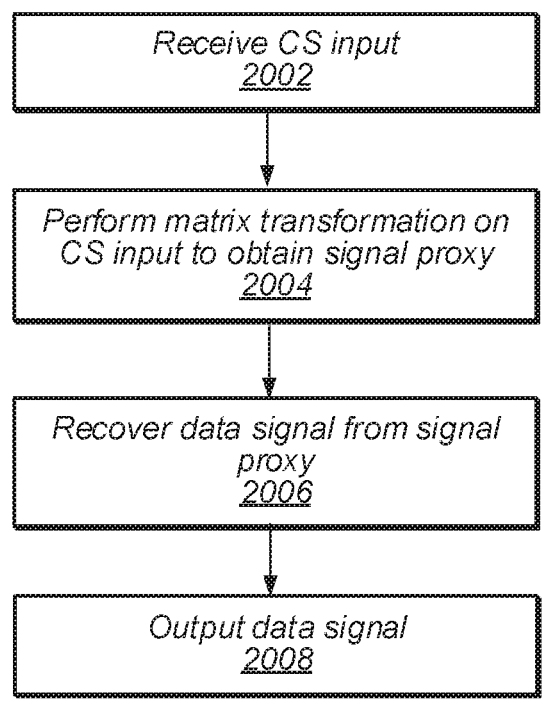
FIG. 20 is a flow chart diagram illustrating a method for using a trained convolutional neural network to perform compressive sensing imaging, according to some embodiments.

FIG. 20—Using a Trained CNN to Perform Signal Recovery

FIG. 20 is a flow chart diagram illustrating a method for using a trained CNN to perform CS signal recovery of a data signal, according to some embodiments. In various embodiments, CS signal recovery may be performed on any of a variety of types of images or other signals. For example, the data signal may be an image of a person or a biological organism, an X-Ray image, a magnetic resonance imaging (MRI) image, a computerized tomography (CT) scan image, or a hyperspectral image. In other embodiments, the CNN may perform signal recovery on another type of signal, such as a radar signal, a speech signal, a seismic signal, accelerometer data, or a wireless communication signal.

In some embodiments, the measurement vector is of a smaller data size than the data signal. The measurement vector may be a result of a previously performed compressive measurement based on a measurement matrix, wherein said matrix multiplication is a multiplication of the measurement vector by an adjoint of the measurement matrix. In various embodiments, the method steps detailed below may be performed by a compressive sensing imaging device, by a processing element coupled to a memory medium, or by another type of computing device.

At 2002, compressive sensing (CS) input may be received that comprises the measurement vector.

At 2004, a matrix transformation may be performed on the CS input to obtain a signal proxy, wherein the signal proxy may be the same size as the data signal. The signal proxy may comprise a zeroth layer of the CNN.

At 2006, the data signal may be recovered from the signal proxy by processing the signal proxy at each of a plurality of subsequent layers of the CNN. The subsequent layers of the CNN may be associated with respective filters, channels, weight functions, and bias functions. A final subsequent layer may contain a single filter that produces a single feature map that constitutes the recovered data signal. A detailed discussion of the recovery process is described in greater detail below, in reference to FIG. 21.

At 2008, the recovered data signal may be output by the computing device.

Figure 21:
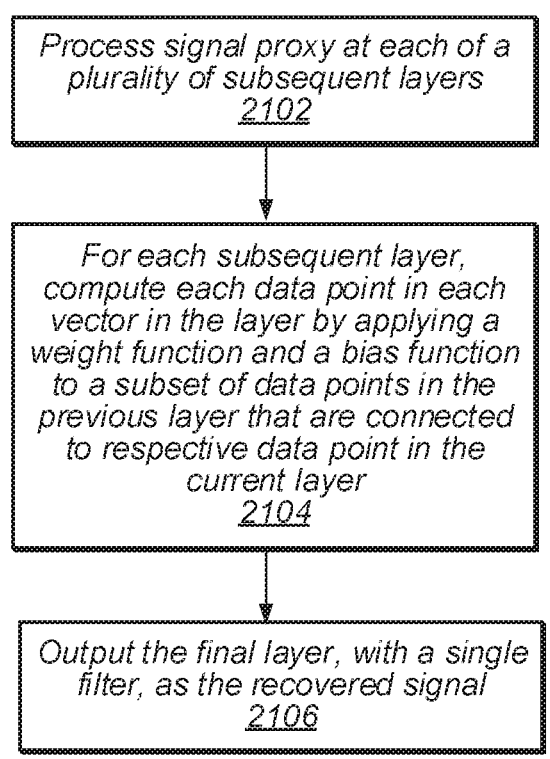
FIG. 21 is a detailed flow chart diagram describing the functional role of subsequent layers of the convolutional neural network for performing compressive sensing imaging, according to some embodiments.

FIG. 21—Recovering Signal Output from Signal Proxy

FIG. 21 is a detailed flow-chart diagram illustrating method steps for recovering a signal output from a signal proxy, according to various embodiments. For example, FIG. 21 supplies additional description associated with either of step 1906 from FIGS. 19 and 2006 of FIG. 20.

At 2102, the signal proxy may be processed at each of a plurality of subsequent layers of the CNN. Each of the subsequent layers may comprise one or more filters and channels, wherein each filter comprises a vector of data points, and wherein each channel connects a data point in a respective vector of data points to a subset of data points in a filter in a previous layer.

At 2104, for each subsequent layer (i.e., each nonzero $n^{th}$ layer), each data point in each vector in the $n^{th}$ layer may be computed by applying a weight function and a bias function to the subset of data points in the $(n-1)^{th}$ layer that are connected to each respective data point in the $n^{th}$ layer. In some embodiments, processing the signal proxy at each of the plurality of subsequent layers of the CNN may involve applying a Leaky ReLU nonlinearity function to outputs of the weight and bias functions. In some embodiments, processing the signal proxy at each of a plurality of subsequent layers of the CNN comprises, for each filter within a respective layer, applying the same weight function to each data point. In some embodiments, each layer of the CNN beyond the zeroth layer may employ batch normalization.

The final layer may contain a single filter that results in a single feature map comprising the recovered signal output. In some embodiments, a single weight function is shared between all data points within a filter in a respective layer.

At 2106, the final layer, with a single filter, may output the recovered signal.

In some embodiments, a method for training a convolutional neural network (CNN) to perform signal recovery may proceed as follows. The method may be performed by a processing element coupled to a memory medium. The processing element may determine values for parameters of the CNN, wherein the CNN includes N processing layers, wherein N is greater than two. A zeroth layer of the processing layers may be configured to receive a measurement vector and multiply the measurement vector by an adjoint of a measurement matrix (e.g., a compressive sensing measurement matrix) to obtain zeroth layer feature map comprising a signal proxy. Each layer k after the zeroth layer may include one or more filters to respectively produce one or more layer-k feature maps, wherein each of the one or more filters is configured to generate the corresponding layer-k feature map based on one or more or all of the features of maps of the previous processing layer k−1. The parameters of the CNN may include convolution kernels and bias parameters of the filters of the processing layers after the zeroth layer, wherein the convolution kernels (e.g., the W matrices described above) have support smaller than the size of the signal proxy.

In these embodiments, said determining values for parameters of the CNN may involve estimating a minimum of a loss function as function of the parameters of the CNN, wherein said loss function is a sum of deviations corresponding to input-output pairs in a training data set. Each input-output pair (y,x) of the training data set may include a signal x and a measurement vector y, wherein the measurement vector y represents a compressive sensing measurement of signal x based on the measurement matrix.

In some embodiments, said determining values for parameters of the CNN may be implemented using backpropagation. In some embodiments, the last of the processing layers may include only one filter. In some embodiments, earlier processing layers after the zeroth processing layer may include larger numbers of filters than later layers. For example, a first of the processing layers after the zeroth layer may include a larger number of filters than a second of the processing layers after the zeroth layer.

Figure 22:
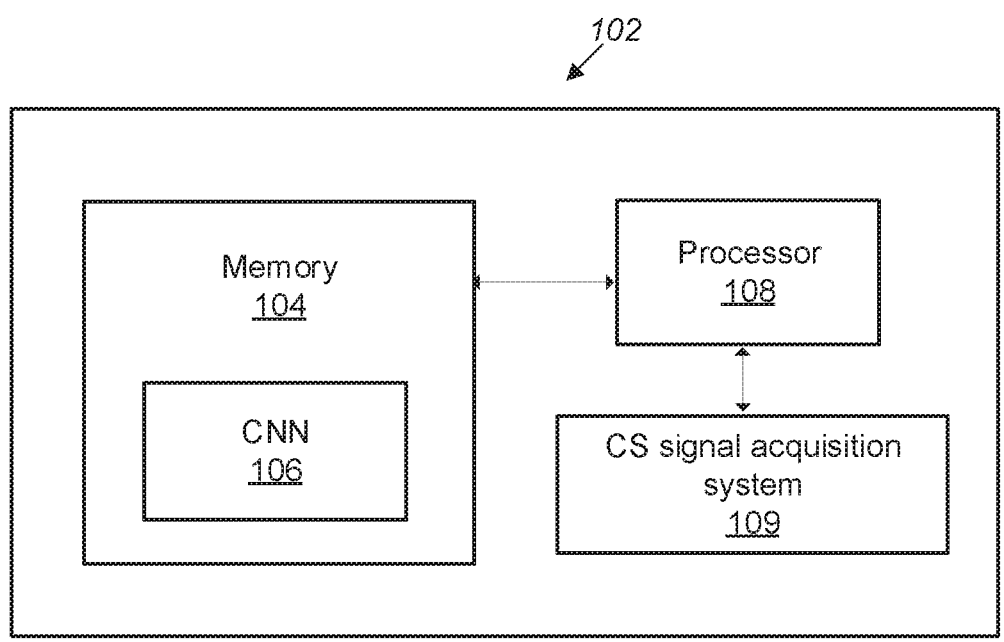
FIG. 22 is a diagram of a compressive sensing imaging device, according to some embodiments.

FIG. 22—Compressive Sensing Device

FIG. 2 is a schematic diagram of a compressive sensing device 102, according to some embodiments. As illustrated, the compressive sensing device contains a memory 104 (such as a non-transitory computer readable memory medium, or another type of memory or memories) that has stored thereupon a convolutional neural network, or CNN (106). The memory 102 is coupled to a processor 108 that is configured to perform computations according to embodiments described herein. The processor 108 is further coupled to a CS signal acquisition system 109. According to various embodiments, the CS signal acquisition system may be configured to acquire a variety of types of CS input. For example, the CS signal acquisition system may be a CS camera or other imaging device, as described in further detail in reference to FIG. 23. The compressive sensing device 102 may be any of a single-pixel camera, an X-ray imager, a magnetic resonance imaging (MM) device, a computerized tomography (CT) scan device, a hyperspectral image, or another type of CS imaging device, and the CS signal acquisition system may be a system designed to obtain CS input for the particular type of image associated with the CS imaging device. Alternatively, the CS signal acquisition system 109 may be configured to acquire CS input corresponding to a radar signal, a speech signal, a seismic signal, accelerometer data, or a wireless communication signal, and the compressive sensing device may be a corresponding type of signal processing device.

Figure 23:
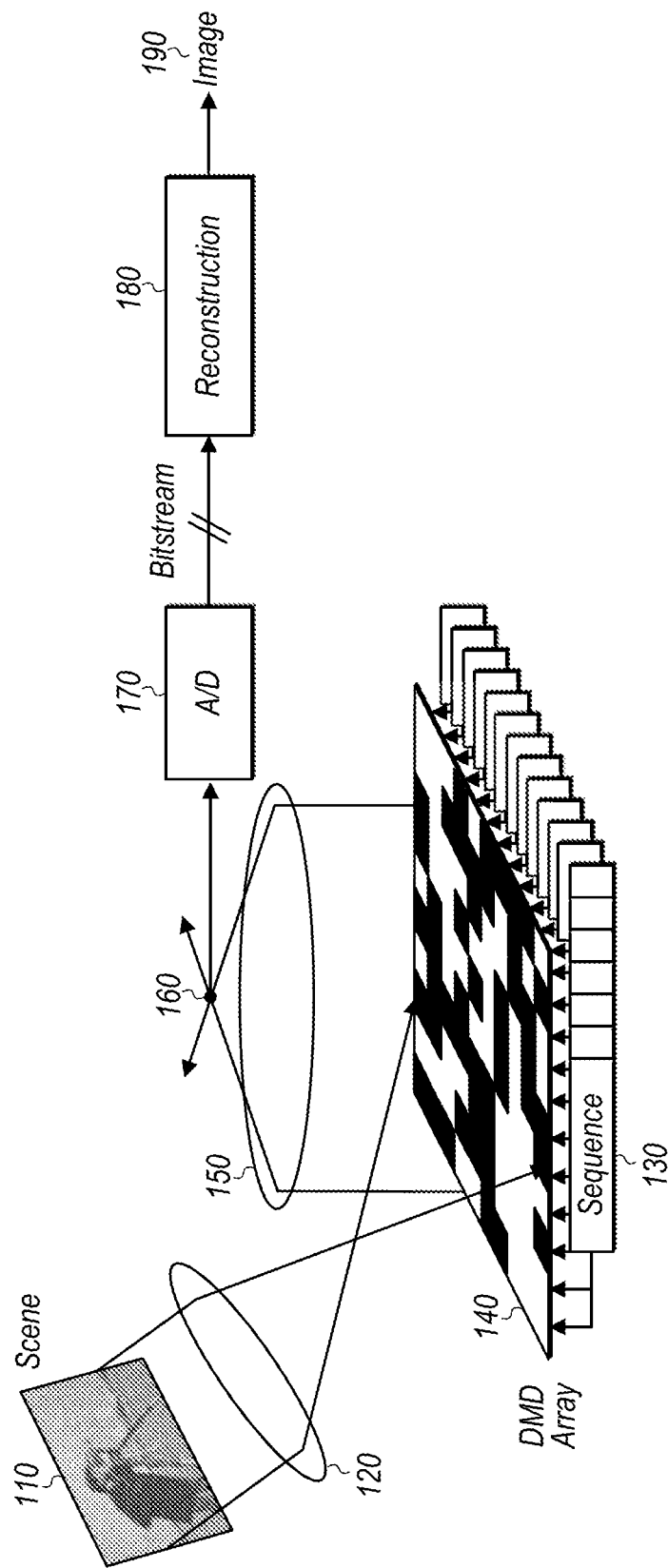
FIG. 23 is a schematic illustration of compressive sensing image reconstruction, according to some embodiments.

FIG. 23—Compressive Sensing Imaging Device

FIG. 23 shows a compressive sensing (CS) imaging device, which may be used to implement embodiments described herein. An incident light field 110 corresponding to the desired image x passes through a lens 120 and is then reflected off a digital micromirror device (DMD) array 140 whose mirror orientations are modulated in the pseudorandom pattern sequence supplied by the random number generator or generators 130. Each different mirror pattern produces a voltage at the single photodiode detector 160 that corresponds to one measurement y(m). While only one photodetector is shown in FIG. 23, any number of detectors may be used, although typically, the number of photodetectors will be less than the total number of ultimate number of pixels obtained in the image. The voltage level is then quantized by an analog-to-digital converter 170. All of components 120, 130, 140, 150, 160, and 170 may collectively be referred to as a "CS image acquisition apparatus" or the "CS signal acquisition system" 109. The bitstream produced is then communicated to a reconstruction processor 180 (e.g., the CNN algorithms described above), which yields the output image 190. The reconstruction processor 180 may comprise a non-transitory computer readable memory medium (e.g., memory 104 from FIG. 22) coupled to a processing element (e.g., processor 108 from FIG. 22) and a convolutional neural network (CNN 106), which may be configured to implement embodiments described herein.

An embodiment of the invention employs a digital micromirror device (DMD) for generating the random modulation basis patterns. The DMD may consist of a 1024×768 array (or another size array) of electrostatically actuated micromirrors where each mirror of the array is suspended above an individual SRAM cell. Each mirror rotates about a hinge and can be positioned in one of two states (e.g., +12 degrees and −12 degrees from horizontal, or another range); thus light falling on the DMD may be reflected in two directions depending on the orientation of the mirrors. Note that the DMD is one possible embodiment, but many additional embodiments are possible.

Referring again to FIG. 23, with the help of a biconvex lens 120, the desired image is formed on the DMD plane 140; this image acts as an object for the second biconvex lens 150, which focuses the image onto the photodiode 160. The light is collected from one of the two directions in which it is reflected (e.g., the light reflected by mirrors in the +12 degree state). The light from a given configuration of the DMD mirrors 140 may be summed at the photodiode 160 to yield an absolute voltage that yields a coefficient y(m) for that configuration. The output of the photodiode 160 may be amplified through an op-amp circuit and then digitized by a 12-bit analog to digital converter 170. These are details of one specific embodiment of the invention. Various additional embodiments are also possible and will be apparent to those of skill in the art.

The CS imaging device may be configured to produce various types of images. For example, the CS imaging device may be configured to produce any of standard camera images, an X-Ray image, a magnetic resonance imaging (MRI) image, a computerized tomography (CT) scan image, or a hyperspectral image.

Embodiments presented herein developed a DeepInverse framework for sensing and recovering signals. This framework can learn a structured representation from training data and efficiently approximate a signal recovery at a small fraction of the cost of state-of-the-art recovery algorithms.

Embodiments of the present disclosure may be realized in any of various forms. For example, in some embodiments, the present invention may be realized as a computer-implemented method, a computer-readable memory medium, or a computer system. In other embodiments, the present invention may be realized using one or more custom-designed hardware devices such as ASICs. In other embodiments, the present invention may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A compressive sensing (CS) imaging device, comprising:
   a CS image acquisition apparatus;
   a non-transitory computer-readable memory medium comprising a convolutional neural network (CNN); and
   a processing element coupled to the image acquisition apparatus and the memory medium, wherein the processing element is configured to:

a) receive compressive sensing (CS) input from the CS image acquisition apparatus that comprises a measurement vector of a reference image;
b) perform a matrix transformation on the CS input to obtain a signal proxy, wherein the matrix transformation is determined based on a second matrix transformation used to obtain the measurement vector from the reference image, and wherein the signal proxy comprises a zeroth layer of the CNN;
b) train the CNN using the signal proxy, wherein training the CNN further comprises computing adjusted weight and bias functions associated with subsequent layers of the CNN based on the signal proxy; and
c) store the adjusted weight and bias functions in the memory medium to obtain a trained CNN.

2. The CS imaging device of claim 1, wherein the matrix transformation comprises applying an adjoint of a matrix used to obtain the measurement vector from the reference image.

3. The CS imaging device of claim 1, wherein each subsequent layer of the CNN employs batch normalization.

4. The CS imaging device of claim 1, wherein a single weight function is shared between all data points within a filter in a respective subsequent layer of the CNN.

5. The CS imaging device of claim 1, wherein computing adjusted weight and bias functions associated with subsequent layers of the CNN based on the signal proxy comprises applying a Leaky ReLU function within each subsequent layer.

6. The CS imaging device of claim 1, wherein subsequent to training the CNN, the processing element is further configured to:
use the trained CNN to compute and output a recovered image from CS input, wherein the CS input comprises a smaller dimension than the recovered image.

7. The method of claim 6, wherein the recovered image is a magnetic resonance imaging (MRI) image.

8. The method of claim 6, wherein the recovered image is a computerized tomography (CT) scan.

9. A method for training a convolutional neural network (CNN) to perform signal recovery, the method comprising:
by a processing element coupled to a memory medium:
a) receiving compressive sensing (CS) input that comprises a measurement vector of a reference signal;
b) performing a matrix transformation on the CS input to obtain a signal proxy, wherein the matrix transformation is determined based on a second matrix transformation used to obtain the measurement vector from the reference signal, wherein the signal proxy comprises a zeroth layer of the CNN;
c) computing a recovered signal output from the signal proxy by processing the signal proxy at each of a plurality of subsequent layers of the CNN, wherein the subsequent layers of the CNN are associated with respective filters, channels, weight functions, and bias functions, and wherein the final subsequent layer comprises a single filter that produces the recovered signal output;
d) computing a loss function based at least in part on a comparison of the recovered signal output to the reference signal;
e) employing backpropagation, wherein backpropagation comprises adjusting weight and bias functions associated with the layers of the CNN to reduce the loss function in a subsequent computation of the recovered signal output;
f) repeating each of c), d), and e) one or more times; and
g) subsequent to a final employment of backpropagation, storing the adjusted weight and bias functions in the memory medium to obtain a trained CNN.

10. The method of claim 9, wherein the matrix transformation comprises applying an adjoint of a matrix used to obtain the measurement vector from the reference signal.

11. The method of claim 9, wherein processing the signal proxy at each of a plurality of subsequent layers of the CNN comprises applying a Leaky ReLU function to the output of the weight and bias functions.

12. The method of claim 9, wherein a single weight function is shared between all data points within a filter in a respective layer.

13. The method of claim 9, wherein said processing the signal proxy at each of a plurality of subsequent layers of the CNN comprises, for each filter within a respective layer, applying the same weight function to each data point.

14. The method of claim 9, wherein subsequent to training the CNN, the method further comprises:
using the trained CNN to compute and output a recovered signal from a CS signal input, wherein the CS signal input comprises a smaller dimension than the recovered signal.

15. The method of claim 9, wherein the reference signal represents one or more of the following:
an image of a person or a biological organism;
an X-Ray image, a magnetic resonance imaging (MM) image, or a computerized tomography (CT) scan image;
a hyperspectral image;
a radar signal;
a speech signal;
a seismic signal;
accelerometer data; and
a wireless communication signal.

16. The method of claim 9, wherein the recovered signal output is obtained without running an optimization-based algorithm.

17. The method of claim 9, wherein the matrix transformation applies to the entire CS input, and does not apply a block diagonal matrix transformation.

18. A method for using a compressive sensing (CS) device comprising a convolutional neural network (CNN) to recover a data signal from compressive sensing input, the method comprising:
by a processing element coupled to a memory medium:
a) receiving the compressive sensing (CS) input that comprises a measurement vector of the data signal;
b) performing a matrix transformation on the CS input to obtain a signal proxy, wherein the matrix transformation is determined based on a second matrix transformation used to obtain the measurement vector from the data signal, wherein the signal proxy is the same size as the data signal, and wherein the signal proxy comprises a zeroth layer of the CNN;
c) recovering the data signal from the signal proxy by processing the signal proxy at each of a plurality of subsequent layers of the CNN, wherein the subsequent layers of the CNN are associated with respective filters, channels, weight functions, and bias functions, and wherein a final subsequent layer comprises a single filter that produces the recovered data signal; and
d) outputting the recovered data signal.

19. The method of claim 18, wherein the measurement vector is a result of a previously performed compressive measurement based on a measurement matrix, wherein said matrix transformation is a multiplication of the measurement vector by an adjoint of the measurement matrix.

20. The method of claim 18, wherein the data signal represents one or more of the following:
- an image of a person or a biological organism;
- an X-Ray image, a magnetic resonance imaging (MM) image, or a computerized tomography (CT) scan image;
- a hyperspectral image;
- a radar signal;
- a speech signal;
- a seismic signal;
- accelerometer data; and
- a wireless communication signal.

* * * * *

UNITED STATES PATENT AND TRADEMARK OFFICE
CERTIFICATE OF CORRECTION

PATENT NO. : 10,985,777 B2  
APPLICATION NO. : 16/466718  
DATED : April 20, 2021  
INVENTOR(S) : Richard G. Baraniuk and Ali Mousavi Page 1 of 1

It is certified that error appears in the above-identified patent and that said Letters Patent is hereby corrected as shown below:

In the Claims

Claim 1, Column 21, Line 10, delete "b) train the CNN using the signal proxy, wherein" and insert -- c) train the CNN using the signal proxy, wherein --.

Claim 1, Column 21, Line 15, delete "c) store the adjusted weight and bias functions in the" and insert -- d) store the adjusted weight and bias functions in the --.

Claim 9, Column 22, Line 1, delete "f) repeating each of c), d), and e) one or more times; and" and insert -- f) repeating each of c), d) and e) one or more times; and --.

Claim 15, Column 22, Line 28, delete "an X-Ray image, a magnetic resonance imaging (MM)" and insert -- an X-Ray image, a magnetic resonance imaging (MRI) --.

Claim 20, Column 23, Line 7, delete "an X-Ray image, a magnetic resonance imaging (MM)" and insert -- an X-Ray image, a magnetic resonance imaging (MRI) --.

Signed and Sealed this  
First Day of June, 2021

Drew Hirshfeld  
*Performing the Functions and Duties of the  
Under Secretary of Commerce for Intellectual Property and  
Director of the United States Patent and Trademark Office*